(12) United States Patent
Kato et al.

(10) Patent No.: US 10,243,538 B2
(45) Date of Patent: Mar. 26, 2019

(54) HIGH-FREQUENCY FILTER, MULTIPLEXER, HIGH-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventors: Masanori Kato, Nagaokakyo (JP); Syunsuke Kido, Nagaokakyo (JP); Minoru Iwanaga, Nagaokakyo (JP); Hiroshi Matsubara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/032,098

(22) Filed: Jul. 11, 2018

(65) Prior Publication Data
US 2019/0028085 A1    Jan. 24, 2019

(30) Foreign Application Priority Data

Jul. 21, 2017    (JP) .................. 2017-142287

(51) Int. Cl.
| | |
|---|---|
| *H04B 1/38* | (2015.01) |
| *H03H 9/54* | (2006.01) |
| *H03H 9/56* | (2006.01) |
| *H03H 9/70* | (2006.01) |
| *H04B 1/00* | (2006.01) |
| *H03H 7/01* | (2006.01) |
| *H03F 3/19* | (2006.01) |

(52) U.S. Cl.
CPC .......... *H03H 9/542* (2013.01); *H03H 7/0115* (2013.01); *H03H 9/568* (2013.01); *H03H 9/70* (2013.01); *H04B 1/0053* (2013.01); *H03F 3/19* (2013.01)

(58) Field of Classification Search
CPC ........ H03H 9/25; H03H 9/725; H03H 9/6483; H03H 9/64; H03H 9/02559; H03H 9/14541; H03H 9/02992; H03H 9/145; H03H 9/542; H03H 9/6433; H03H 9/54; H03H 9/0576; H03H 9/02574; H03H 9/1071; H03H 9/205; H03H 9/706; H03H 9/02834
USPC ......................................................... 455/73
See application file for complete search history.

(56) References Cited

U.S. PATENT DOCUMENTS

2006/0284703 A1* 12/2006 Iwasaki ............... H03H 9/0004
                                                             333/133
2009/0128260 A1    5/2009 Block et al.
(Continued)

FOREIGN PATENT DOCUMENTS

JP    2009-538005 A    10/2009

*Primary Examiner* — Ajibola A Akinyemi
(74) *Attorney, Agent, or Firm* — Keating & Bennett, LLP

(57) ABSTRACT

A high-frequency filter coupled between an input-output terminal and another input-output terminal includes series arm resonators, parallel arm resonators, and an inductor defining an LC resonant circuit. Frequencies at a first attenuation pole defined by resonant frequencies or anti-resonant frequencies of the series arm resonators and the parallel arm resonators and a frequency at a second attenuation pole defined by a resonant frequency of the LC resonant circuit are included in one stop band of the high-frequency filter, and the frequencies at the first attenuation pole are located closer than the frequency at the second attenuation pole to a pass band of the high-frequency filter.

20 Claims, 11 Drawing Sheets

(56) References Cited

U.S. PATENT DOCUMENTS

2012/0286900 A1* 11/2012 Kadota .............. H03H 9/02559
333/188
2015/0222246 A1* 8/2015 Nosaka ................ H03H 9/6483
333/187

* cited by examiner

HIGH-FREQUENCY FILTER, MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-142287 filed on Jul. 21, 2017. The entire contents of this application are hereby incorporated herein by reference.

BACKGROUND OF THE INVENTION

1. Field of the Invention

The present invention relates to a high-frequency filter, a multiplexer, a high-frequency front-end circuit, and a communication device each including an elastic wave resonator.

2. Description of the Related Art

To date, a high-frequency filter having an elastic wave resonator has been proposed. For example, a high-frequency filter including an LC resonant circuit and an elastic wave resonator has been disclosed (see, for example, Japanese Unexamined Patent Application Publication No. 2009-538005). In this high-frequency filter, the elastic wave resonator and the LC resonant circuit each define a band-elimination filter (BEF). This configuration makes it possible to form two stop bands: a stop band of the elastic wave resonator near a pass band and a stop band of the LC resonant circuit that is higher than the stop band of the elastic wave resonator by one octave or more.

Although the existing high-frequency filter described above is able to increase the steepness of an attenuation slope formed to extend from the pass band to the stop band with a sharp attenuation pole of the elastic wave resonator, the stop band of the elastic wave resonator is narrow. For example, recently, a multiplexer in which respective terminals at ends of a plurality of high-frequency filters are guided into a common terminal has been used to handle carrier aggregation (CA). Such a multiplexer is designed such that the stop band of one of the plurality of high-frequency filters overlaps the pass band of another one of the high-frequency filters. However, in a case in which the stop band of the one high-frequency filter is narrow, it is difficult to sufficiently attenuate a signal in the pass band of the other high-frequency filter. In this respect, for example, increasing the number of elastic wave resonators included in the high-frequency filter makes it possible to broaden the stop band. However, an insertion loss within the pass band increases as the number of elastic wave resonators is increased.

SUMMARY OF THE INVENTION

Preferred embodiments of the present invention provide high-frequency filters, multiplexers, high-frequency front-end circuits, and communication devices that are able to broaden a stop band while reducing an insertion loss within a pass band.

According to a preferred embodiment of the present invention, a high-frequency filter is coupled between a first input-output terminal and a second input-output terminal. The high-frequency filter includes at least one elastic wave resonator and a first inductor defining a portion of an LC resonant circuit. A frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter. The frequency at the first attenuation pole is located closer than the frequency at the second attenuation pole to a pass band of the high-frequency filter.

With the high-frequency filter configured in this manner, since the frequency at the first attenuation pole is located close to the pass band of the high-frequency filter, the steepness of an attenuation slope extending from the pass band to the one stop band is able to be increased by the steep first attenuation pole of the elastic wave resonator, and an insertion loss within the pass band is reduced. In addition, since the frequency at the first attenuation pole and the frequency at the second attenuation pole are included in the one stop band, in other words, since the one stop band is defined by the first attenuation pole and the second attenuation pole, the one stop band is able to be broadened by the second attenuation pole of the LC resonant circuit. Accordingly, the stop band is able to be broadened while the insertion loss within the pass band is reduced.

The at least one elastic wave resonator may define a low pass filter or a high pass filter with a capacitance component.

With this configuration, since the elastic wave resonator includes the capacitance component, the low pass filter or the high pass filter is able to be defined by coupling the elastic wave resonator to an inductor, and a broad pass band is able to be provided with the low pass filter or the high pass filter. In addition, by allowing the elastic wave resonator and the LC resonant circuit each to operate as a notch filter to attenuate a portion of the pass band, the stop band is able to be broadened while the insertion loss within the pass band is reduced, and the pass band is able to be further broadened.

The at least one elastic wave resonator may be defined by a first elastic wave resonator and a second elastic wave resonator. The high-frequency filter may further include a first capacitor, a second inductor, and a third inductor. The first inductor, the second inductor, and the second elastic wave resonator may be coupled in series on a path connecting the first input-output terminal and the second input-output terminal. The first capacitor may be coupled in parallel to the first inductor. The first elastic wave resonator may be coupled between a ground and a node that is coupled directly to the second inductor on the path. The third inductor may be coupled between a ground and a node that is coupled directly to the second elastic wave resonator on the path. The first capacitor, together with the first inductor, may define an LC parallel resonant circuit defining and functioning as the LC resonant circuit. The second inductor, together with a capacitance component of the first elastic wave resonator, may define the low pass filter. The third inductor, together with a capacitance component of the second elastic wave resonator, may define the high pass filter.

The at least one elastic wave resonator may be defined by a first elastic wave resonator. The high-frequency filter may further include a first capacitor. The first inductor may be provided on a path connecting the first input-output terminal and the second input-output terminal. The first capacitor may be coupled in parallel to the first inductor. The first elastic wave resonator may be coupled between a ground and a node that is coupled directly to the first inductor on the path. The first capacitor, together with the first inductor, may define an LC parallel resonant circuit defining and functioning as the LC resonant circuit. The first inductor, together with a capacitance component of the first elastic wave resonator, may further define the low pass filter.

This configuration makes it possible to achieve a high-frequency filter having a broad pass band ranging from about 1427 MHz to about 2200 MHz with a highly steep attenuation slope on the high-frequency side and a broad stop band ranging from about 2300 MHz to about 2690 MHz that is located on the higher-frequency side of the pass band.

The at least one elastic wave resonator may be defined by a second elastic wave resonator. The high-frequency filter may further include a first capacitor. The second elastic wave resonator may be provided on a path connecting the first input-output terminal and the second input-output terminal. The first capacitor and the first inductor may be coupled in series. A circuit in which the first capacitor and the first inductor are coupled in series may be coupled between a ground and a node that is coupled directly to the second elastic wave resonator on the path. The first capacitor, together with the first inductor, may define an LC series resonant circuit defining and functioning as the LC resonant circuit. The first inductor, together with a capacitance component of the second elastic wave resonator, may further define the high pass filter.

This configuration makes it possible to achieve a high-frequency filter having a broad pass band ranging from about 1710 MHz to about 2200 MHz with a highly steep attenuation slope on the high-frequency side and a broad stop band ranging from about 2300 MHz to about 2690 MHz that is located on the higher-frequency side of the pass band. This configuration also makes it possible to achieve a high-frequency filter having a broad pass band ranging from about 1710 MHz to about 2690 MHz with a highly steep attenuation slope on the low-frequency side and a broad stop band ranging from about 1427 MHz to about 1606 MHz that is located on the lower-frequency side of the pass band.

The at least one elastic wave resonator may be defined by a second elastic wave resonator. The high-frequency filter may further include a first capacitor and a third inductor. The second elastic wave resonator may be provided on a path connecting the first input-output terminal and the second input-output terminal. The first capacitor and the first inductor may be coupled in series. A circuit in which the first capacitor and the first inductor are coupled in series may be coupled between a ground and the path. The third inductor may be coupled between a ground and a node that is coupled directly to the second elastic wave resonator on the path. The first capacitor, together with the first inductor, may define an LC series resonant circuit defining and functioning as the LC resonant circuit. The third inductor, together with a capacitance component of the second elastic wave resonator, may define the high pass filter.

This configuration makes it possible to achieve a high-frequency filter having a broad pass band ranging from about 2300 MHz to about 2690 MHz with a highly steep attenuation slope on the low-frequency side and a broad stop band ranging from about 1427 MHz to about 2200 MHz that is located on the lower-frequency side of the pass band.

The at least one elastic wave resonator may be defined by a first series arm resonator, a second series arm resonator, and a first parallel arm resonator. The first series arm resonator and the second series arm resonator may be coupled in series on a path connecting the first input-output terminal and the second input-output terminal. The first parallel arm resonator may be coupled between a ground and a node between the first series arm resonator and the second series arm resonator. The first inductor may be coupled in parallel to a circuit in which the first series arm resonator and the second series arm resonator are coupled in series. A capacitance component of the first series arm resonator and a capacitance component of the second series arm resonator, together with the first inductor, may define an LC parallel resonant circuit defining and functioning as the LC resonant circuit. The first series arm resonator, the second series arm resonator, and the first parallel arm resonator may define a band pass filter.

This configuration makes it possible to achieve a high-frequency filter having a pass band ranging from about 2300 MHz to about 2400 MHz with a highly steep attenuation slope on the low-frequency side and a broad stop band ranging from about 1427 MHz to about 2200 MHz that is located on the lower-frequency side of the pass band.

The high-frequency filter may further include a fourth inductor and a first capacitor that define a portion of a second LC resonant circuit. The first capacitor and the fourth inductor may be coupled in series. A circuit in which the first capacitor and the fourth inductor are coupled in series may be coupled between a ground and a node that is coupled directly to the first input-output terminal or the second input-output terminal on the path. The circuit in which the first capacitor and the fourth inductor are coupled in series, together with the first inductor, may define an LC series resonant circuit defining and functioning as the second LC resonant circuit.

This configuration makes it possible to achieve a high-frequency filter having a pass band ranging from about 2496 MHz to about 2690 MHz with a highly steep attenuation slope on the low-frequency side and a broad stop band ranging from about 1427 MHz to about 2400 MHz that is located on the lower-frequency side of the pass band. This configuration also makes it possible to achieve a high-frequency filter having a pass band ranging from about 2300 MHz to about 2690 MHz with a highly steep attenuation slope on the low-frequency side and a broad stop band ranging from about 1427 MHz to about 2200 MHz that is located on the lower-frequency side of the pass band.

According to a preferred embodiment of the present invention, a multiplexer includes a plurality of filters including at least one of the high-frequency filters described above. Input terminals or output terminals of the respective filters are coupled directly or indirectly to a common terminal.

This configuration makes it possible to provide a multiplexer that is able to broaden the stop band while reducing the insertion loss within the pass band.

The plurality of filters may include two filters.

This configuration makes it possible to provide a diplexer that is able to broaden the stop band while reducing the insertion loss within the pass band.

The plurality of filters may include three filters.

This configuration makes it possible to provide a triplexer that is able to broaden the stop band while reducing the insertion loss within the pass band.

The three filters may include a filter having a pass band ranging from about 600 MHz to about 960 MHz, a filter having a pass band ranging from about 1427 MHz to about 2200 MHz, and a filter having a pass band ranging from about 2300 MHz to about 2690 MHz.

This configuration makes it possible to selectively or simultaneously transmit and/or receive a signal in a frequency band ranging from about 600 MHz to about 960 MHz, a signal in a frequency band ranging from about 1427 MHz to about 2200 MHz, and a signal in a frequency band ranging from about 2300 MHz to about 2690 MHz.

The plurality of filters may include four filters.

This configuration makes it possible to provide a quadplexer that is able to broaden the stop band while reducing the insertion loss within the pass band.

The four filters may include a filter having a pass band ranging from about 600 MHz to about 960 MHz, a filter having a pass band ranging from about 1427 MHz to about 2200 MHz, a filter having a pass band ranging from about 2300 MHz to about 2400 MHz, and a filter having a pass band ranging from about 2496 MHz to about 2690 MHz.

This configuration makes it possible to selectively or simultaneously transmit and/or receive a signal in a frequency band ranging from about 600 MHz to about 960 MHz, a signal in a frequency band ranging from about 1427 MHz to about 2200 MHz, a signal in a frequency band ranging from about 2300 MHz to about 2400 MHz, and a signal in a frequency band ranging from about 2496 MHz to about 2690 MHz.

The plurality of filters may include a low pass filter.

This configuration makes it possible to achieve a filter having a pass band ranging from about 600 MHz to about 960 MHz with the low pass filter.

Signals in a plurality of frequency bands corresponding to the respective filters may be transmitted and/or received simultaneously.

This configuration makes it possible to handle carrier aggregation (CA).

According to a preferred embodiment of the present invention, a high-frequency front-end circuit includes one of the multiplexers according to preferred embodiments described above and a switch coupled directly or indirectly to the multiplexer.

This configuration makes it possible to provide a high-frequency front-end circuit that is able to broaden the stop band while reducing the insertion loss within the pass band.

According to a preferred embodiment of the present invention, a high-frequency front-end circuit includes one of the multiplexers according to preferred embodiments described above and an amplification circuit coupled directly or indirectly to the multiplexer.

This configuration makes it possible to provide a high-frequency front-end circuit that is able to broaden the stop band while reducing the insertion loss within the pass band.

According to a preferred embodiment of the present invention, a communication device includes an RF signal processing circuit that processes a high-frequency signal transmitted and/or received via an antenna element and one of the high-frequency front-end circuits according to preferred embodiments of the present invention described above that transmits the high-frequency signal between the antenna element and the RF signal processing circuit.

This configuration makes it possible to provide a communication device that is able to broaden the stop band while reducing the insertion loss within the pass band.

The high-frequency filters, multiplexers, high-frequency front-end circuits, and communication devices according to preferred embodiments of the present invention are able to broaden the stop band while reducing the insertion loss within the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
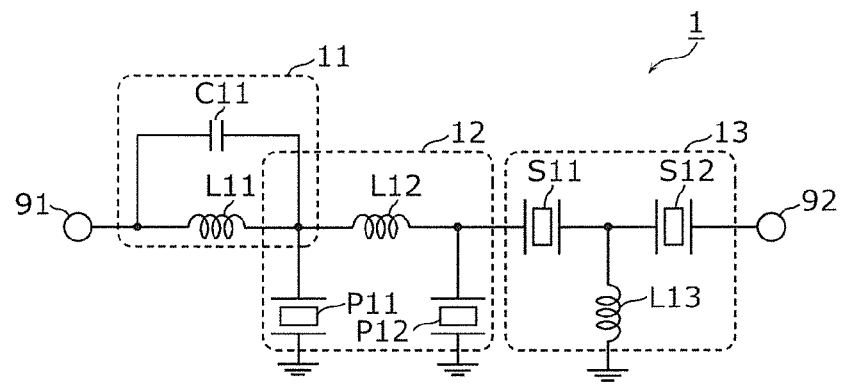
FIG. 1 is a circuit configuration diagram of a high-frequency filter according to Example 1 of a preferred embodiment of the present invention.

Hereinafter, preferred embodiments of the present invention will be described in detail with reference to the drawings. It is to be noted that the preferred embodiments described hereinafter merely illustrate general or specific examples. The numerical values, the shapes, the materials, the constituent elements, the arrangement of the constituent elements, the connection modes of the elements, and other features indicated in the following preferred embodiments are examples and are not intended to limit the present invention. Among the elements described in the following preferred embodiments, elements that are not described in independent claims are described as optional elements. In the drawings, configurations that are identical or substantially identical are given identical reference characters, and duplicate descriptions thereof may be omitted or simplified. In the following preferred embodiments, the term "to be coupled" means not only a case in which components are coupled directly but also a case in which components are coupled electrically with another element or the like interposed therebetween.

Preferred Embodiment 1

Hereinafter, a configuration and filter characteristics of a high-frequency filter according to Preferred Embodiment 1 of the present invention will be described with reference to Examples 1 to 8. What is common among Examples 1 to 8 is that a high-frequency filter is coupled between a first input-output terminal and a second input-output terminal and includes at least one elastic wave resonator and a first inductor defining a portion of an LC resonant circuit. What is also common among Examples 1 to 8 is that a frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter and that the frequency at the first attenuation pole is located closer than the frequency at the second attenuation pole to a pass band of the high-frequency filter. Hereinafter, Examples 1 to 8 will be described with reference to FIG. 1 to FIG. 16.

A configuration of a high-frequency filter 1 according to Example 1 will be described.

FIG. 1 is a circuit configuration diagram of the high-frequency filter 1 according to Example 1. The high-frequency filter 1 illustrated in FIG. 1 includes inductors L11, L12, and L13, a capacitor C11, series arm resonators S11 and S12, parallel arm resonators P11 and P12, and input-output terminals 91 (first input-output terminal) and 92 (second input-output terminal). In Example 1, the at least one elastic wave resonator includes the series arm resonators S11 and S12 and the parallel arm resonators P11 and P12. In a case in which the input-output terminal 91 defines an input terminal to which a high-frequency signal is input, the input-output terminal 92 defines an output terminal. In a case in which the input-output terminal 92 defines an input terminal to which a high-frequency signal is input, the input-output terminal 91 defines an output terminal.

The inductor L11 is a first inductor defining a portion of an LC resonant circuit 11 and is provided on a path connecting the input-output terminal 91 and the input-output terminal 92. The inductor L11 is coupled to the input-output terminal 91. The inductor L12 is a second inductor provided on the path connecting the input-output terminal 91 and the input-output terminal 92 and is coupled to the inductor L11. The series arm resonators S11 and S12 are second elastic wave resonators provided on the path connecting the input-output terminal 91 and the input-output terminal 92. The series arm resonator S11 is coupled to the inductor L12, and the series arm resonator S12 is coupled to the series arm resonator S11 and the input-output terminal 92. The inductor L11, the inductor L12, the series arm resonator S11, and the series arm resonator S12 are coupled in series on the path connecting the input-output terminal 91 and the input-output terminal 92.

The capacitor C11 is a first capacitor coupled in parallel to the inductor L11. The capacitor C11, together with the inductor L11, defines an LC parallel resonant circuit, or the LC resonant circuit 11.

The parallel arm resonators P11 and P12 are first elastic wave resonators each coupled between a ground and a node that is coupled directly to the inductor L12 on the path connecting the input-output terminal 91 and the input-output terminal 92. Specifically, the parallel arm resonator P11 is coupled to a ground and a node between the inductor L11 and the inductor L12. The parallel arm resonator P12 is coupled to a ground and a node between the inductor L12 and the series arm resonator S11. The inductor L12, together with capacitance components of the parallel arm resonators P11 and P12, defines a low pass filter (LPF) 12. It is to be noted that "to be coupled directly" means that the elements are coupled without any other component interposed therebetween.

The inductor L13 is a third inductor coupled between a ground and a node that is coupled directly to the series arm resonators S11 and S12 on the path connecting the input-output terminal 91 and the input-output terminal 92. Specifically, the inductor L13 is coupled to a ground and a node between the series arm resonator S11 and the series arm resonator S12. The inductor L13, together with capacitance components of the series arm resonators S11 and S12, defines a high pass filter (HPF) 13.

The number of the first inductor and the number of the first capacitor each defining the LC resonant circuit 11 are not limited to one each, and two or more first inductors and two or more first capacitors may be provided. In addition, the number (series coupling number) of the second inductor defining the LPF 12 is not limited to one, and two or more second inductors may be provided. The number (parallel coupling number) of the first elastic wave resonators is not limited to two, and one first elastic wave resonator or three or more first elastic wave resonators may be provided. Furthermore, the number (parallel coupling number) of the third inductor constituting the HPF 13 is not limited to one, and two or more third inductors may be provided. The number (series coupling number) of the second elastic wave resonators may be one or three or more. Although the high-frequency filter 1 includes one LC resonant circuit 11, the high-frequency filter 1 may include two or more LC resonant circuits. For example, the high-frequency filter 1 may be defined at least by the inductors L11 to L13, the capacitor C11, the parallel arm resonator P11, and the series arm resonator S11.

The at least one elastic wave resonator (the series arm resonators S11 and S12 and the parallel arm resonators P11 and P12 in Example 1) is a resonator that utilizes an elastic wave and is, for example, a resonator that utilizes a SAW (Surface Acoustic Wave), a resonator that utilizes a BAW (Bulk Acoustic Wave), an FBAR (Film Bulk Acoustic Resonator), or other elastic wave. It is to be noted that the SAW includes not only a surface acoustic wave but also a boundary wave. In this example, the at least one elastic wave resonator is preferably a SAW resonator. This configuration makes it possible to define the high-frequency filter 1 with an IDT (InterDigital Transducer) electrode provided on a substrate having piezoelectricity, which in turn makes it possible to achieve a small-sized, low-profile filter circuit having bandpass characteristics with high steepness. The substrate has piezoelectricity in at least a surface thereof. Such a substrate may be defined, for example, by a multi-layer body including a piezoelectric thin film on a surface thereof and a film having an acoustic velocity different from that of the piezoelectric thin film, a support substrate, and other elements. In addition, such a substrate may, for example, be a multilayer body that includes a high acoustic velocity support substrate and a piezoelectric thin film provided on the high acoustic velocity support substrate; a multilayer body that includes a high acoustic velocity support substrate, a low acoustic velocity film provided on the high acoustic velocity support substrate, and a piezoelectric thin film provided on the low acoustic velocity film; or a multilayer body that includes a support substrate, a high acoustic velocity film provided on the support substrate, a low acoustic velocity film provided on the high acoustic velocity film, and a piezoelectric thin film provided on the low acoustic velocity film. Such a substrate may have piezoelectricity throughout the substrate. The foregoing descriptions apply similarly to elastic wave resonators described in Examples 2 to 8, and thus the descriptions will be omitted in Examples 2 to 8.

Next, filter characteristics of the high-frequency filter 1 according to Example 1 will be described.

Figure 2:
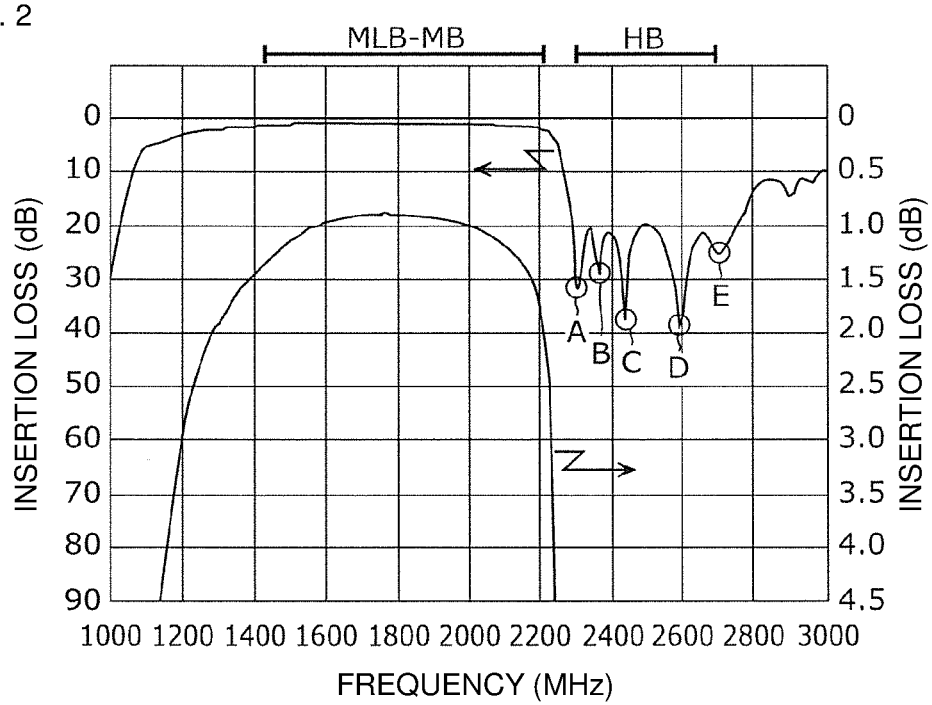
FIG. 2 illustrates filter characteristics of the high-frequency filter according to Example 1.

FIG. 2 illustrates the filter characteristics of the high-frequency filter 1 according to Example 1.

The series arm resonators S11 and S12 and the parallel arm resonators P11 and P12 include capacitance components. Thus, the LPF 12 is defined by the inductor L12 that is coupled to the parallel arm resonators P11 and P12, and the HPF 13 is defined by the inductor L13 that is coupled to the series arm resonators S11 and S12.

In the high-frequency filter 1, a broad pass band is able to be provided by the LPF 12 and the HPF 13. For example, designing the LPF 12 and the HPF 13 in such a manner that the pass band of the LPF 12 and the pass band of the HPF 13 are contiguous with each other makes it possible to provide one broad pass band. In addition, by adjusting, as appropriate, the design parameters of the series arm resonators S11 and S12, the parallel arm resonators P11 and P12, and the LC resonant circuit 11, the series arm resonators S11 and S12, the parallel arm resonators P11 and P12, and the LC resonant circuit 11 each operate as a notch filter that attenuates the bandpass characteristics in the respective resonant frequencies or anti-resonant frequencies. This configuration allows the series arm resonators S11 and S12, the parallel arm resonators P11 and P12, and the LC resonant circuit 11 to attenuate a portion of the broad pass band defined by the LPF 12 and the HPF 13. Attenuating a portion of the broad pass band makes it possible to provide two pass bands: a pass band on the lower-frequency side of the attenuated frequency band and a pass band on the higher-frequency side of the attenuated frequency band, for example. The resonant frequency is a frequency at which an impedance of a resonator or a resonant circuit is minimum (ideally zero), and the anti-resonant frequency is a frequency at which an impedance of a resonator or a resonant circuit is maximum (ideally infinity).

For example, an attenuation pole indicated by a portion A in FIG. 2 (referred to as an attenuation pole A) corresponds to the anti-resonant frequency of the series arm resonator S12, an attenuation pole indicated by a portion B in FIG. 2 (referred to as an attenuation pole B) corresponds to the anti-resonant frequency of the series arm resonator S11, an attenuation pole indicated by a portion C in FIG. 2 (referred to as an attenuation pole C) corresponds to the resonant frequency of the parallel arm resonator P11, and an attenuation pole indicated by a portion D in FIG. 2 (referred to as an attenuation pole D) corresponds to the resonant frequency of the parallel arm resonator P12. In addition, for example, an attenuation pole indicated by a portion E in FIG. 2 (referred to as an attenuation pole E) corresponds to the resonant frequency of the LC resonant circuit 11.

As illustrated in FIG. 2, frequencies at the attenuation poles A to D (first attenuation pole) including the anti-resonant frequencies of the series arm resonators S11 and S12 and the resonant frequencies of the parallel arm resonators P11 and P12 and a frequency at the attenuation pole E (second attenuation pole) including the resonant frequency of the LC resonant circuit 11 are included in one stop band of the high-frequency filter 1. With this configuration, the attenuation poles A to D and the attenuation pole E define the one stop band, and thus this one stop band is able to be broadened by the attenuation pole E of the LC resonant circuit 11. The one stop band is preferably, for example, a band in which the insertion loss is no lower than about 10 dB. Specifically, the one stop band is a frequency band ranging from a point at which the insertion loss increases to reach or exceed about 10 dB to a point at which the insertion loss reaches or falls below about 10 dB as the frequency increases. For example, two stop bands are present in a case in which the insertion loss reaches or exceeds about 10 dB and then reaches or falls below about 10 dB and the insertion loss again reaches or exceeds about 10 dB and then reaches or falls below about 10 dB as the frequency increases.

The frequencies at the attenuation poles A to D are located closer than the frequency at the attenuation pole E to the pass band of the high-frequency filter 1. The attenuation poles of the elastic wave resonators are very steep, and the frequencies at the attenuation poles A to D (in particular, the attenuation pole A) are located close to the pass band of the high-frequency filter 1. Thus, the steepness of the attenuation slope provided, by the steep attenuation poles A to D, to extend from the pass band of the high-frequency filter 1 to the one stop band is able to be increased.

In Example 1, as the design parameters of the series arm resonators S11 and S12, the parallel arm resonators P11 and P12, the inductors L11 to L13, and the capacitor C11 are adjusted as appropriate, the pass band of the high-frequency filter 1 preferably ranges from, for example, about 1427 MHz to about 2200 MHz, corresponding to a band ranging from an MLB (Middle Low Band) to an MB (Middle Band). In addition, the stop band of the high-frequency filter 1 preferably ranges from, for example, about 2300 MHz to about 2690 MHz, corresponding to an HB (High Band).

This configuration makes it possible to achieve a high-frequency filter having a broad pass band ranging from about 1427 MHz to about 2200 MHz with a very steep attenuation slope on the high-frequency side and a broad stop band ranging from about 2300 MHz to about 2690 MHz that is located on the higher-frequency side of the pass band. In this manner, the stop band is able to be broadened while the insertion loss within the pass band is reduced.

A configuration of a high-frequency filter 2 according to Example 2 will be described.

Figure 3:
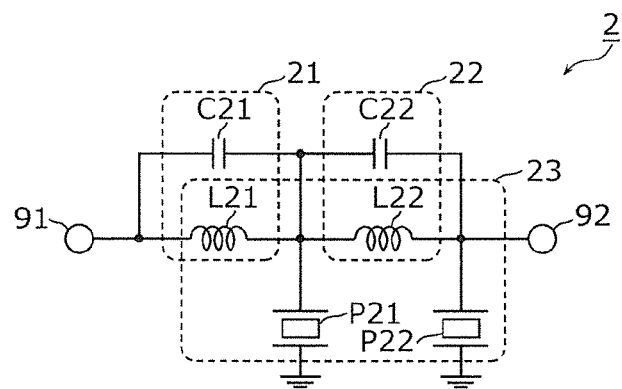
FIG. 3 is a circuit configuration diagram of a high-frequency filter according to Example 2 of a preferred embodiment of the present invention.

FIG. 3 is a circuit configuration diagram of the high-frequency filter 2 according to Example 2. The high-frequency filter 2 illustrated in FIG. 3 includes inductors L21 and L22, capacitors C21 and C22, parallel arm resonators P21 and P22, and input-output terminals 91 (first input-output terminal) and 92 (second input-output terminal). In Example 2, the at least one elastic wave resonator includes the parallel arm resonators P21 and P22.

The inductors L21 and L22 are first inductors defining a portion of respective LC resonant circuits 21 and 22 and are provided on a path connecting the input-output terminal 91 and the input-output terminal 92. The inductor L21 is coupled to the input-output terminal 91, and the inductor L22 is coupled to the input-output terminal 92. The inductor L21 and the inductor L22 are coupled in series on the path connecting the input-output terminal 91 and the input-output terminal 92.

The capacitors C21 and C22 are first capacitors coupled in parallel to the inductors L21 and L22, respectively. Specifically, the capacitor C21 is coupled in parallel to the inductor L21, and the capacitor C22 is coupled in parallel to the inductor L22. The capacitor C21, together with the inductor L21, defines an LC parallel resonant circuit, or the LC resonant circuit 21; and the capacitor C22, together with the inductor L22, defines an LC parallel resonant circuit, or the LC resonant circuit 22.

The parallel arm resonators P21 and P22 are first elastic wave resonators coupled between a ground and nodes coupled directly to the inductors L21 and L22, respectively, on the path connecting the input-output terminal 91 and the input-output terminal 92. Specifically, the parallel arm resonator P21 is coupled to a ground and a node between the inductor L21 and the inductor L22. The parallel arm resonator P22 is coupled to a ground and a node between the inductor L22 and the input-output terminal 92. The inductors L21 and L22, together with capacitance components of the parallel arm resonators P21 and P22, further define an LPF 23. The inductors L21 and L22 define the LC parallel resonant circuit as well as the LPF 23.

The number of the first inductors and the number of the first capacitors defining the respective LC resonant circuits 21 and 22 are not limited to one each, and two or more first inductors and two or more first capacitors may be provided. Although the high-frequency filter 2 includes two LC resonant circuits, the high-frequency filter 2 may include one LC resonant circuit or three or more LC resonant circuits. In addition, the number (series coupling number) of the first inductors defining the LPF 23 is not limited to two, and one first inductor or three or more first inductors may be provided. The number (parallel coupling number) of the first elastic wave resonators is not limited to two, and one first elastic wave resonator or three or more first elastic wave resonators may be provided. For example, the high-frequency filter 2 may be defined at least by the inductor L21, the capacitor C21, and the parallel arm resonator P21.

Next, filter characteristics of the high-frequency filter 2 according to Example 2 will be described.

Figure 4:
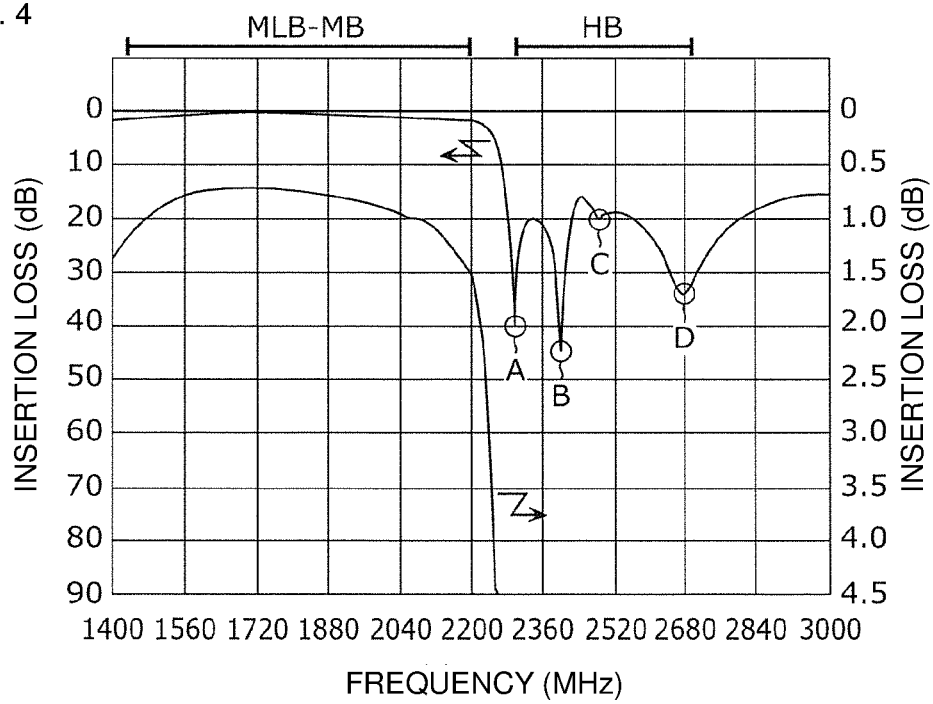
FIG. 4 illustrates filter characteristics of the high-frequency filter according to Example 2.

FIG. 4 illustrates the filter characteristics of the high-frequency filter 2 according to Example 2.

The parallel arm resonators P21 and P22 include capacitance components. Thus, the LPF 23 is defined by the inductors L21 and L22 that are coupled to the parallel arm resonators P21 and P22.

In the high-frequency filter 2, a broad pass band is able to be provided by the LPF 23. In addition, by adjusting, as appropriate, the design parameters of the parallel arm resonators P21 and P22 and the LC resonant circuits 21 and 22, the parallel arm resonators P21 and P22 and the LC resonant circuits 21 and 22 each operate as a notch filter that attenuates the bandpass characteristics in the respective resonant frequencies. This configuration allows the parallel arm resonators P21 and P22 and the LC resonant circuits 21 and 22 to attenuate a portion of the broad pass band provided by the LPF 23.

For example, an attenuation pole indicated by a portion A in FIG. 4 (referred to as an attenuation pole A) corresponds to the resonant frequency of the parallel arm resonator P21, and an attenuation pole indicated by a portion B in FIG. 4 (referred to as an attenuation pole B) corresponds to the resonant frequency of the parallel arm resonator P22. In addition, for example, an attenuation pole indicated by a portion C in FIG. 4 (referred to as an attenuation pole C) corresponds to the resonant frequency of the LC resonant circuit 21, and an attenuation pole indicated by a portion D in FIG. 4 (referred to as an attenuation pole D) corresponds to the resonant frequency of the LC resonant circuit 22.

As illustrated in FIG. 4, frequencies at the attenuation poles A and B (first attenuation pole) defined by the resonant frequencies of the parallel arm resonators P21 and P22 and frequencies at the attenuation poles C and D (second attenuation pole) defined by the resonant frequencies of the LC resonant circuits 21 and 22 are included in one stop band of the high-frequency filter 2. With this configuration, the attenuation poles A and B and the attenuation poles C and D define the one stop band, and thus this one stop band is able to be broadened by the attenuation poles C and D of the LC resonant circuits 21 and 22.

In addition, the frequencies at the attenuation poles A and B are located closer than the frequencies at the attenuation poles C and D to the pass band of the high-frequency filter 2. The attenuation poles of the elastic wave resonators are very steep, and the frequencies at the attenuation poles A and B (in particular, the attenuation pole A) are located close to the pass band of the high-frequency filter 2. Thus, the steepness of the attenuation slope provided, by the steep attenuation poles A and B, to extend from the pass band of the high-frequency filter 2 to the one stop band is able to be increased.

In Example 2, as the design parameters of the parallel arm resonators P21 and P22, the inductors L21 and L22, and the capacitors C21 and C22 are adjusted as appropriate, the pass band of the high-frequency filter 2 preferably ranges from, for example, about 1427 MHz to about 2200 MHz, corresponding to a band ranging from the MLB to the MB. In addition, the stop band of the high-frequency filter 2 preferably ranges from, for example, about 2300 MHz to about 2690 MHz, corresponding to the HB.

This configuration makes it possible to achieve a high-frequency filter having a broad pass band ranging from about 1427 MHz to about 2200 MHz with a very steep attenuation slope on the high-frequency side and a broad stop band ranging from about 2300 MHz to about 2690 MHz that is located on the higher-frequency side of the pass band. In this manner, the stop band is able to be broadened while the insertion loss within the pass band is reduced.

A configuration of a high-frequency filter 3 according to Example 3 will be described.

Figure 5:
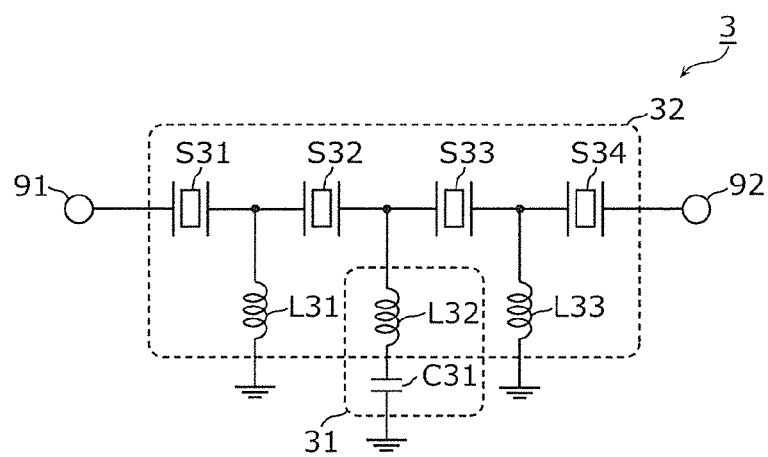
FIG. 5 is a circuit configuration diagram of a high-frequency filter according to Example 3 of a preferred embodiment of the present invention.

FIG. 5 is a circuit configuration diagram of the high-frequency filter 3 according to Example 3. The high-frequency filter 3 illustrated in FIG. 5 includes inductors L31 to L33, a capacitor C31, series arm resonators S31 to S34, and input-output terminals 91 (first input-output terminal) and 92 (second input-output terminal). In Example 3, the at least one elastic wave resonator includes the series arm resonators S31 to S34.

The series arm resonators S31 to S34 are second elastic wave resonators provided on a path connecting the input-output terminal 91 and the input-output terminal 92. The series arm resonator S31 is coupled to the input-output terminal 91, the series arm resonator S32 is coupled to the series arm resonator S31, the series arm resonator S33 is coupled to the series arm resonator S32, and the series arm resonator S34 is coupled to the series arm resonator S33 and the input-output terminal 92. The series arm resonators S31 to S34 are coupled in series on the path connecting the input-output terminal 91 and the input-output terminal 92.

The inductor L32 is a first inductor defining a portion of an LC resonant circuit 31. The capacitor C31 is a first capacitor coupled in series to the inductor L32. The circuit in which the capacitor C31 and the inductor L32 are coupled in series is coupled between a ground and a node that is coupled directly to the second elastic wave resonators (e.g., the series arm resonator S32) on the path connecting the input-output terminal 91 and the input-output terminal 92. Specifically, this circuit is coupled to a ground and a node between the series arm resonator S32 and the series arm resonator S33. The capacitor C31, together with the inductor L32, defines an LC series resonant circuit, or the LC resonant circuit 31.

The inductors L31 and L33 are third inductors coupled between a ground and nodes that are coupled directly to any one of the series arm resonators S31 to S34 on the path connecting the input-output terminal 91 and the input-output terminal 92. Specifically, the inductor L31 is coupled to a ground and a node between the series arm resonator S31 and the series arm resonator S32, and the inductor L33 is coupled to a ground and a node between the series arm resonator S33 and the series arm resonator S34. The inductors L31 to L33, together with capacitance components of the series arm resonators S31 to S34, define an HPF 32. The inductor L32 defines the LC series resonant circuit as well as the HPF 32.

The number of the first inductor and the number of the first capacitor defining the LC resonant circuit 31 are not limited to one each, and two or more first inductors and two or more first capacitors may be provided. Although the high-frequency filter 3 includes one LC resonant circuit 31, the high-frequency filter 3 may include two or more LC resonant circuits. In addition, the number (parallel coupling number) of the first inductor and the third inductors defining the HPF 32 is not limited to three, and one first or third inductor, two first and third inductors, or four or more first and third inductors may be provided. The number (series coupling number) of the second elastic wave resonators is not limited to four, and one to three second elastic wave resonator(s) or five or more second elastic wave resonators may be provided. For example, the high-frequency filter 3 may be defined at least by the inductor L32, the capacitor C31, and the series arm resonator S32.

Next, filter characteristics of the high-frequency filter 3 according to Example 3 will be described.

Figure 6:
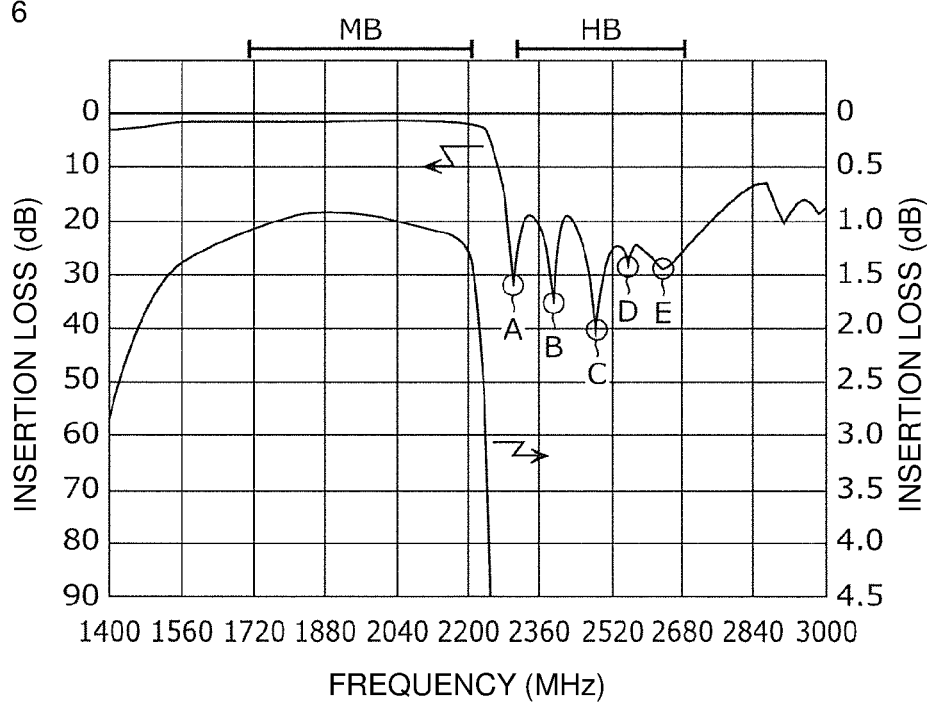
FIG. 6 illustrates filter characteristics of the high-frequency filter according to Example 3.

FIG. 6 illustrates the filter characteristics of the high-frequency filter 3 according to Example 3.

The series arm resonators S31 to S34 include capacitance components. Thus, the HPF 32 is defined by the inductors L31 to L33 that are coupled to the series arm resonators S31 to S34.

In the high-frequency filter 3, a broad pass band is provided by the HPF 32. In addition, by adjusting, as appropriate, the design parameters of the series arm resonators S31 to S34 and the LC resonant circuit 31, the series arm resonators S31 to S34 and the LC resonant circuit 31 each operate as a notch filter that attenuates the bandpass characteristics in the respective resonant frequencies or anti-resonant frequencies. This configuration allows the series arm resonators S31 to S34 and the LC resonant circuit 31 to attenuate a portion of the broad pass band defined by the HPF 32.

For example, an attenuation pole indicated by a portion A in FIG. 6 (referred to as an attenuation pole A) corresponds to the anti-resonant frequency of the series arm resonator S34, an attenuation pole indicated by a portion B in FIG. 6 (referred to as an attenuation pole B) corresponds to the anti-resonant frequency of the series arm resonator S32, an attenuation pole indicated by a portion C in FIG. 6 (referred to as an attenuation pole C) corresponds to the anti-resonant frequency of the series arm resonator S33, and an attenuation pole indicated by a portion D in FIG. 6 (referred to as an attenuation pole D) corresponds to the anti-resonant frequency of the series arm resonator S31. In addition, for example, an attenuation pole indicated by a portion E in FIG. 6 (referred to as an attenuation pole E) corresponds to the resonant frequency of the LC resonant circuit 31.

As illustrated in FIG. 6, frequencies at the attenuation poles A to D (first attenuation pole) defined by the anti-resonant frequencies of the series arm resonators S31 to S34 and a frequency at the attenuation pole E (second attenuation pole) defined by the resonant frequency of the LC resonant circuit 31 are included in one stop band of the high-frequency filter 3. With this configuration, the attenuation poles A to D and the attenuation pole E define the one stop band, and thus the one stop band is able be broadened by the attenuation pole E of the LC resonant circuit 31.

In addition, the frequencies at the attenuation poles A to D are located closer than the frequency at the attenuation pole E to the pass band of the high-frequency filter 3. The attenuation poles of the elastic wave resonators are very steep, and the frequencies at the attenuation poles A to D (in particular, the attenuation pole A) are located close to the pass band of the high-frequency filter 3. Thus, the steepness of the attenuation slope provided, by the steep attenuation poles A to D, to extend from the pass band of the high-frequency filter 3 to the one stop band is able to be increased.

In Example 3, as the design parameters of the series arm resonators S31 to S34, the inductors L31 to L33, and the capacitor C31 are adjusted as appropriate, the pass band of the high-frequency filter 3 preferably ranges from, for example, about 1710 MHz to about 2200 MHz, corresponding to the MB. In addition, the stop band of the high-frequency filter 3 preferably ranges from, for example, about 2300 MHz to about 2690 MHz, corresponding to the HB.

This configuration makes it possible to achieve a high-frequency filter having a broad pass band ranging from about 1710 MHz to about 2200 MHz with a very steep attenuation slope on the high-frequency side and a broad stop band ranging from about 2300 MHz to about 2690 MHz that is located on the higher-frequency side of the pass band. In this manner, the stop band is able to be broadened while the insertion loss within the pass band is reduced.

A configuration of a high-frequency filter 4 according to Example 4 will be described.

Figure 7:
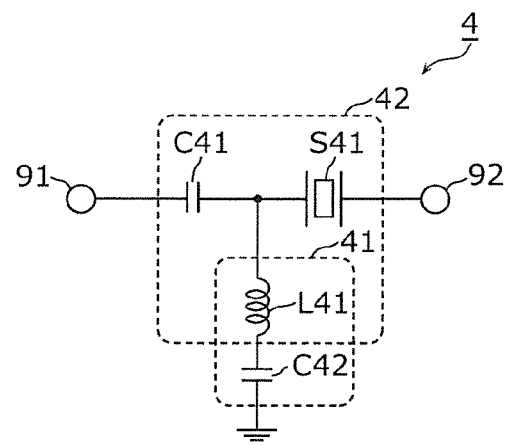
FIG. 7 is a circuit configuration diagram of a high-frequency filter according to Example 4 of a preferred embodiment of the present invention.

FIG. 7 is a circuit configuration diagram of the high-frequency filter 4 according to Example 4. The high-frequency filter 4 illustrated in FIG. 7 includes an inductor L41, capacitors C41 and C42, a series arm resonator S41, and input-output terminals (first input-output terminal) and 92 (second input-output terminal). In Example 4, the at least one elastic wave resonator includes the series arm resonator S41.

The capacitor C41 is provided on a path connecting the input-output terminal 91 and the input-output terminal 92 and is coupled to the input-output terminal 91. The series arm resonator S41 is a second elastic wave resonator provided on the path connecting the input-output terminal 91 and the input-output terminal 92 and is coupled to the capacitor C41 and the input-output terminal 92. The capacitor C41 and the series arm resonator S41 are coupled in series on the path connecting the input-output terminal 91 and the input-output terminal 92.

The inductor L41 is a first inductor defining a portion of an LC resonant circuit 41. The capacitor C42 is a first capacitor coupled in series to the inductor L41. The circuit in which the capacitor C42 and the inductor L41 are coupled in series is coupled between a ground and a node that is coupled directly to the series arm resonator S41 on the path connecting the input-output terminal 91 and the input-output terminal 92. Specifically, this circuit is coupled to a ground and a node between the capacitor C42 and the series arm resonator S41. The capacitor C42, together with the inductor L41, defines an LC series resonant circuit, or the LC resonant circuit 41.

The inductor L41, together with the capacitor C41 and a capacitance component of the series arm resonator S41, defines an HPF 42. The inductor L41 defines the LC series resonant circuit as well as the HPF 42. In Example 3, the capacitance components of the series arm resonators S31 to S34 are used to define the HPF 32. Alternatively, the HPF 42 may be defined using not only the capacitance component of the series arm resonator S41 but also the capacitor C41, as in Example 4.

The number of the first inductor and the number of the first capacitor defining the LC resonant circuit 41 are not limited to one each, and two or more first inductors and two or more first capacitors may be provided. Although the high-frequency filter 4 includes one LC resonant circuit 41, the high-frequency filter 4 may include two or more LC resonant circuits. In addition, the number (parallel coupling number) of the first inductor defining the HPF 42 is not limited to one, and two or more first inductors may be provided. The number (series coupling number) of the second elastic wave resonator is not limited to one, and two or more second elastic wave resonators may be provided. The number (series coupling number) of the capacitor C41 is not limited to one, and two or more capacitors C41 may be provided. Furthermore, one or more third inductors may be coupled in parallel.

Next, filter characteristics of the high-frequency filter 4 according to Example 4 will be described.

Figure 8:
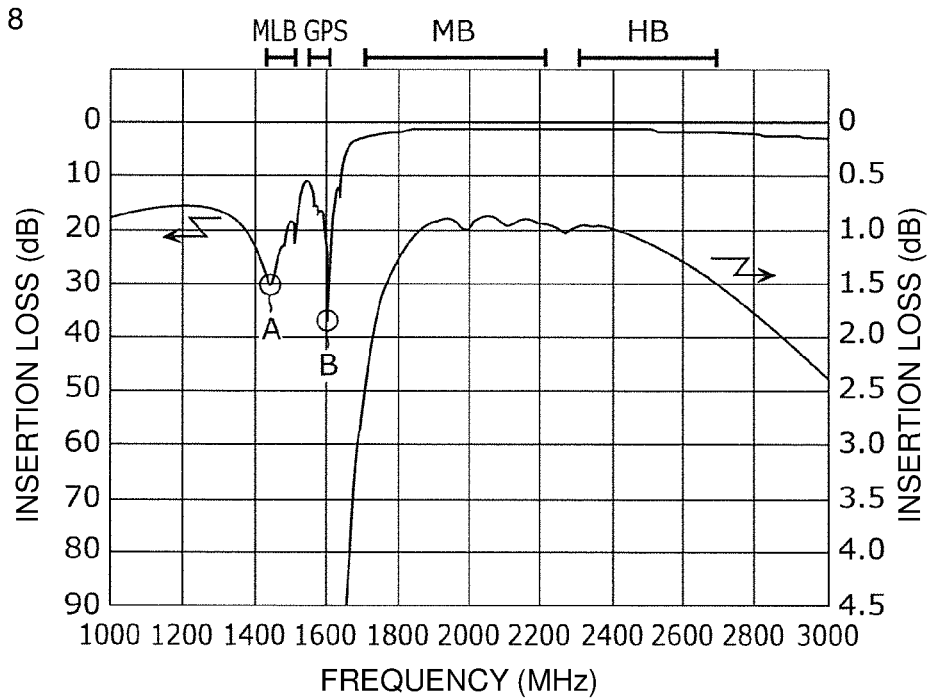
FIG. 8 illustrates filter characteristics of the high-frequency filter according to Example 4.

FIG. 8 illustrates the filter characteristics of the high-frequency filter 4 according to Example 4.

The series arm resonator S41 includes a capacitance component. Thus, the HPF 42 is defined by the inductor L41, the capacitor C41, and the series arm resonator S41 are coupled together.

In the high-frequency filter 4, a broad pass band is provided by the HPF 42. In addition, by adjusting, as appropriate, the design parameters of the series arm resonator S41 and the LC resonant circuit 41, the series arm resonator S41 and the LC resonant circuit 41 each operate as a notch filter that attenuates the bandpass characteristics in the respective resonant frequencies or anti-resonant frequencies. This configuration allows the series arm resonator S41 and the LC resonant circuit 41 to attenuate a portion of the broad pass band defined by the HPF 42.

For example, an attenuation pole indicated by a portion A in FIG. 8 (referred to as an attenuation pole A) corresponds to the resonant frequency of the LC resonant circuit 41. In addition, for example, an attenuation pole indicated by a portion B in FIG. 8 (referred to as an attenuation pole B) corresponds to the anti-resonant frequency of the series arm resonator S41.

As illustrated in FIG. 8, a frequency at the attenuation pole B (first attenuation pole) defined by the anti-resonant frequency of the series arm resonator S41 and a frequency at the attenuation pole A (second attenuation pole) defined by the resonant frequency of the LC resonant circuit 41 are included in one stop band of the high-frequency filter 4. With this configuration, the attenuation pole A and the attenuation pole B define the one stop band, and thus the one stop band is able to be broadened by the attenuation pole A of the LC resonant circuit 41.

In addition, the frequency at the attenuation pole B is located closer than the frequency at the attenuation pole A to the pass band of the high-frequency filter 4. The attenuation pole of the elastic wave resonator is very steep, and the frequency at the attenuation pole B is located close to the pass band of the high-frequency filter 4. Thus, the steepness of the attenuation slope provided, by the steep attenuation pole B, to extend from the pass band of the high-frequency filter 4 to the one stop band is able to be increased.

In Example 4, as the design parameters of the series arm resonator S41, the inductor L41, and the capacitors C41 and C42 are adjusted as appropriate, the pass band of the high-frequency filter 4 preferably ranges from, for example, about 1710 MHz to about 2200 MHz, corresponding to the MB, and from about 2300 MHz to about 2690 MHz, corresponding to the HB. In addition, the stop band of the high-frequency filter 4 preferably ranges from, for example, about 1427 MHz to about 1606 MHz, corresponding to a band ranging from the MLB to a frequency band of a GPS (Global Positioning System). It is to be noted that the MLB ranges from about 1427 MHz to about 1511 MHz, and the frequency band of the GPS ranges from about 1559 MHz to about 1606 MHz.

The above-described configuration makes it possible to achieve a high-frequency filter having a broad pass band ranging from about 1710 MHz to about 2690 MHz with a very steep attenuation slope on the low-frequency side and a broad stop band ranging from about 1427 MHz to about 1606 MHz that is located on the lower-frequency side of the pass band. In this manner, the stop band is able to be broadened while the insertion loss within the pass band is reduced.

A configuration of a high-frequency filter 5 according to Example 5 will be described.

Figure 9:
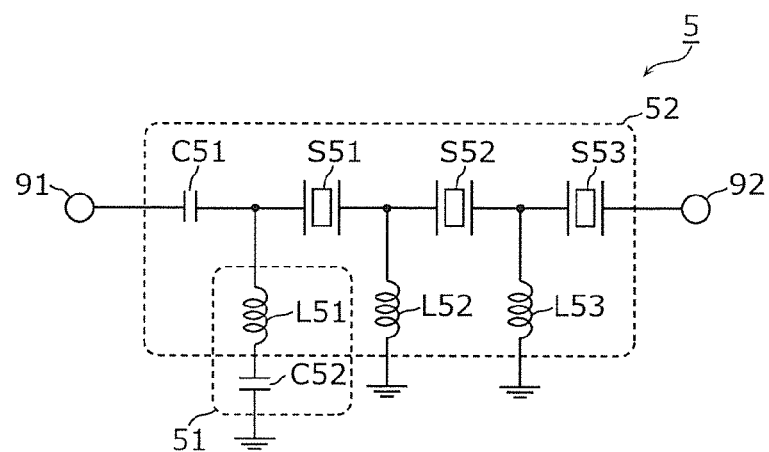
FIG. 9 is a circuit configuration diagram of a high-frequency filter according to Example 5 of a preferred embodiment of the present invention.

FIG. 9 is a circuit configuration diagram of the high-frequency filter 5 according to Example 5. The high-frequency filter 5 illustrated in FIG. 9 includes inductors L51 to L53, capacitors C51 and C52, series arm resonators S51 to S53, and input-output terminals 91 (first input-output terminal) and 92 (second input-output terminal). In Example 5, the at least one elastic wave resonator includes the series arm resonators S51 to S53.

The capacitor C51 is provided on a path connecting the input-output terminal 91 and the input-output terminal 92 and is coupled to the input-output terminal 91. The series arm resonators S51 to S53 are second elastic wave resonators provided on the stated path. The series arm resonator S51 is coupled to the capacitor C51, the series arm resonator S52 is coupled to the series arm resonator S51, and the series arm resonator S53 is coupled to the series arm resonator S52 and the input-output terminal 92. The capacitor C51 and the series arm resonators S51 to S53 are coupled in series on the path connecting the input-output terminal 91 and the input-output terminal 92.

The inductor L51 is a first inductor defining a portion of an LC resonant circuit 51. The capacitor C52 is a first capacitor coupled in series to the inductor L51. The circuit in which the capacitor C52 and the inductor L51 are coupled in series is coupled between a ground and a node that is coupled directly to the second elastic wave resonators (e.g., the series arm resonator S51) on the path connecting the input-output terminal 91 and the input-output terminal 92. Specifically, this circuit is coupled to a ground and a node between the capacitor C51 and the series arm resonator S51. The capacitor C52, together with the inductor L51, defines an LC series resonant circuit, or the LC resonant circuit 51.

The inductors L52 and L53 are third inductors coupled between a ground and nodes that are coupled directly to the series arm resonator S51, S52, or S53 on the path connecting the input-output terminal 91 and the input-output terminal 92. Specifically, the inductor L52 is coupled to a ground and a node between the series arm resonator S51 and the series arm resonator S52, and the inductor L53 is coupled to a ground and a node between the series arm resonator S52 and the series arm resonator S53. The inductors L51 to L53, together with the capacitor C51 and capacitance components of the series arm resonators S51 to S53, define an HPF 52. The inductor L51 defines the LC series resonant circuit as well as the HPF 52.

The number of the first inductor and the number of the first capacitor defining the LC resonant circuit 51 are not limited to one each, and two or more first inductors and two or more first capacitors may be provided. Although the high-frequency filter 5 includes one LC resonant circuit 51, the high-frequency filter 5 may include two or more LC resonant circuits. In addition, the number (parallel coupling number) of the first inductor and the third inductors defining the HPF 52 is not limited to three, and one first or third inductor, two first and third inductors, or four or more first and third inductors may be provided. The number (series coupling number) of the second elastic wave resonators is not limited to three, and one second elastic wave resonator, two second elastic wave resonators, or four or more second elastic wave resonators may be provided. The number (series coupling number) of the capacitor C51 is not limited to one, and two or more capacitors C51 may be provided. For example, the high-frequency filter 5 may be defined at least by the inductor L51, the capacitor C52, and the series arm resonator S51.

Next, filter characteristics of the high-frequency filter 5 according to Example 5 will be described.

Figure 10:
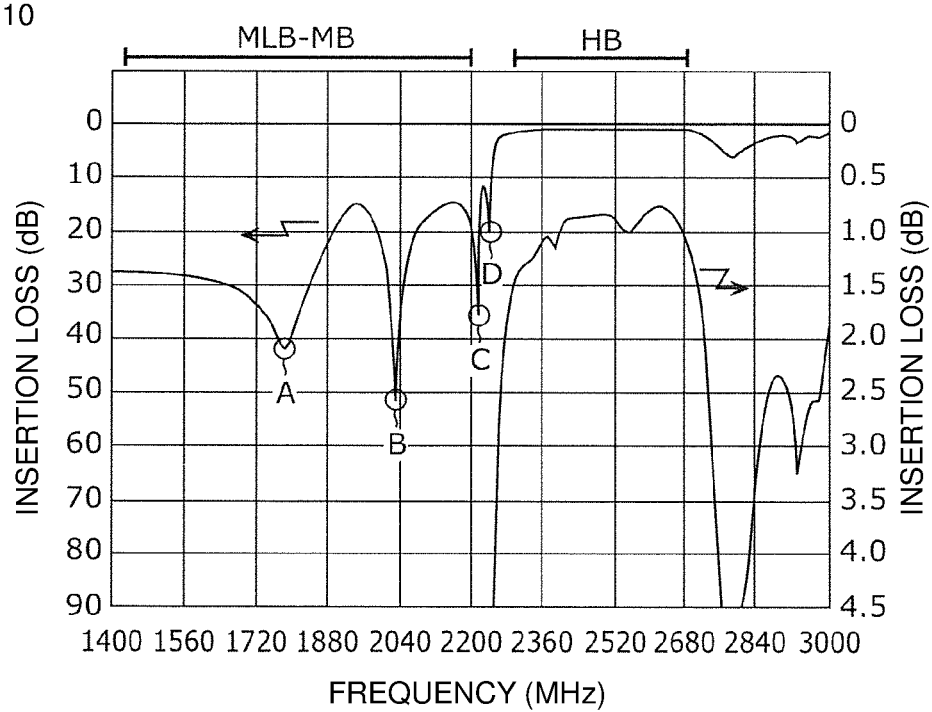
FIG. 10 illustrates filter characteristics of the high-frequency filter according to Example 5.

FIG. 10 illustrates the filter characteristics of the high-frequency filter 5 according to Example 5.

The series arm resonators S51 to S53 include capacitance components. Thus, the HPF 52 is defined by the inductors L51 to L53 and the capacitor C51 that are coupled to the series arm resonators S51 to S53.

In the high-frequency filter 5, a broad pass band is able to be provided by the HPF 52. In addition, by adjusting, as appropriate, the design parameters of the series arm resonators S51 to S53 and the LC resonant circuit 51, the series arm resonators S51 to S53 and the LC resonant circuit 51 each operate as a notch filter that attenuates the bandpass characteristics in the respective resonant frequencies or anti-resonant frequencies. This configuration allows the series arm resonators S51 to S53 and the LC resonant circuit 51 to attenuate a portion of the broad pass band defined by the HPF 52.

For example, an attenuation pole indicated by a portion A in FIG. 10 (referred to as an attenuation pole A) corresponds to the resonant frequency of the LC resonant circuit 51. In addition, for example, an attenuation pole indicated by a portion B in FIG. 10 (referred to as an attenuation pole B) corresponds to the anti-resonant frequency of the series arm resonator S51, an attenuation pole indicated by a portion C in FIG. 10 (referred to as an attenuation pole C) corresponds to the anti-resonant frequency of the series arm resonator S53, and an attenuation pole indicated by a portion D in FIG. 10 (referred to as an attenuation pole D) corresponds to the anti-resonant frequency of the series arm resonator S52.

As illustrated in FIG. 10, frequencies at the attenuation poles B to D (first attenuation pole) defined by the anti-resonant frequencies of the series arm resonators S51 to S53 and a frequency at the attenuation pole A (second attenuation pole) defined by the resonant frequency of the LC resonant circuit 51 are included in one stop band of the high-frequency filter 5. With this configuration, the attenuation pole A and the attenuation poles B to D define the one stop band, and thus the one stop band is able to be broadened by the attenuation pole A of the LC resonant circuit 51.

In addition, the frequencies at the attenuation poles B to D are located closer than the frequency at the attenuation pole A to the pass band of the high-frequency filter 5. The attenuation poles of the elastic wave resonators are very steep, and the frequencies at the attenuation poles B to D (in particular, the attenuation poles C and D) are located close to the pass band of the high-frequency filter 5. Thus, the steepness of the attenuation slope provided, by the steep attenuation poles B to D, to extend from the pass band of the high-frequency filter 5 to the one stop band is able to be increased.

In Example 5, as the design parameters of the series arm resonators S51 to S53, the inductors L51 to L53, and the capacitors C51 and C52 are adjusted as appropriate, the pass band of the high-frequency filter 5 preferably ranges from, for example, about 2300 MHz to about 2690 MHz, corresponding to the HB. In addition, the stop band of the high-frequency filter 5 preferably ranges from, for example, about 1427 MHz to about 2200 MHz, corresponding to a band ranging from the MLB to the MB.

This configuration makes it possible to achieve a high-frequency filter having a broad pass band ranging from about 2300 MHz to about 2690 MHz with a very steep attenuation slope on the low-frequency side and a broad stop band ranging from about 1427 MHz to about 2200 MHz that is located on the lower-frequency side of the pass band. In this manner, the stop band is able to be broadened while the insertion loss within the pass band is reduced.

A configuration of a high-frequency filter 6 according to Example 6 will be described.

Figure 11:
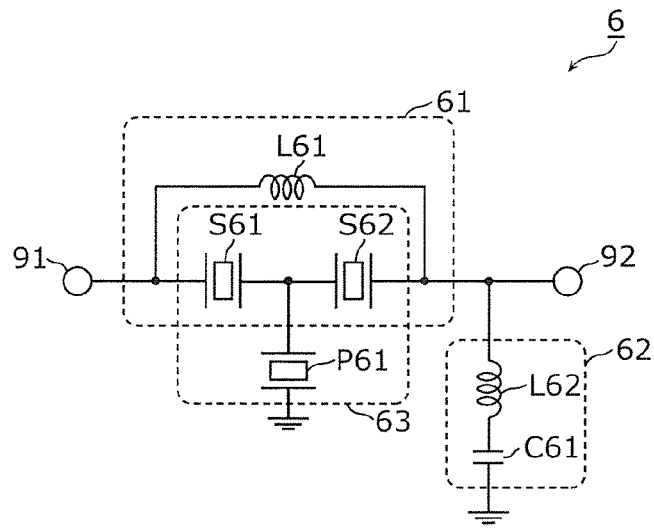
FIG. 11 is a circuit configuration diagram of a high-frequency filter according to Example 6 of a preferred embodiment of the present invention.

FIG. 11 is a circuit configuration diagram of the high-frequency filter 6 according to Example 6. The high-frequency filter 6 illustrated in FIG. 11 includes inductors L61 and L62, a capacitor C61, series arm resonators S61 and S62, a parallel arm resonator P61, and input-output terminals 91 (first input-output terminal) and 92 (second input-output terminal). In Example 6, the at least one elastic wave resonator includes the series arm resonators S61 and S62 and the parallel arm resonator P61.

The series arm resonator S61 is a first series arm resonator provided on a path connecting the input-output terminal 91 and the input-output terminal 92. The series arm resonator S61 is coupled to the input-output terminal 91. The series arm resonator S62 is a second series arm resonator provided on the path connecting the input-output terminal 91 and the input-output terminal 92. The series arm resonator S62 is coupled to the series arm resonator S61 and the input-output terminal 92. The series arm resonator S61 and the series arm resonator S62 are coupled in series on the path connecting the input-output terminal 91 and the input-output terminal 92.

The parallel arm resonator P61 is a first parallel arm resonator coupled between a ground and a node between the series arm resonator S61 and the series arm resonator S62. The series arm resonators S61 and S62 and the parallel arm resonator P61 have a ladder filter structure and define a band pass filter (BPF) 63.

The inductor L61 is a first inductor defining a portion of an LC resonant circuit 61 and is coupled in parallel to a circuit in which the series arm resonator S61 and the series arm resonator S62 are coupled in series. Capacitance components of the series arm resonator S61 and the series arm resonator S62, together with the inductor L61, define an LC parallel resonant circuit, or the LC resonant circuit 61.

The inductor L62 is a fourth inductor defining a portion of a second LC resonant circuit 62. The capacitor C61 is a first capacitor coupled in series to the inductor L62. The circuit in which the capacitor C61 and the inductor L62 are coupled in series is coupled between a ground and the path connecting the input-output terminal 91 and the input-output terminal 92. Specifically, this circuit is coupled to a ground and a node between the series arm resonator S62 and the input-output terminal 92. The capacitor C61, together with the inductor L62, defines an LC series resonant circuit, or the second LC resonant circuit 62.

The number of the first inductor defining the LC resonant circuit 61 is not limited to one, and two or more first inductors may be provided. The number of the fourth inductor and the number of the first capacitor defining the second LC resonant circuit 62 are not limited to one each, and two or more fourth inductors and two or more first capacitors may be provided.

Next, filter characteristics of the high-frequency filter 6 according to Example 6 will be described.

Figure 12:
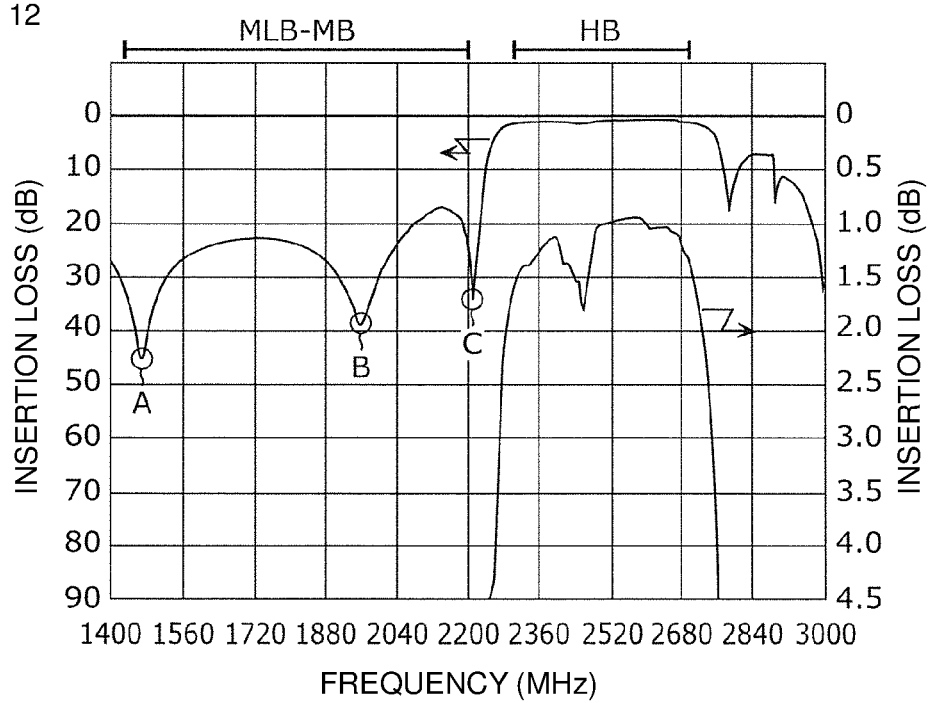
FIG. 12 illustrates filter characteristics of the high-frequency filter according to Example 6.

FIG. 12 illustrates the filter characteristics of the high-frequency filter 6 according to Example 6.

The series arm resonators S61 and S62 and the parallel arm resonator P61 define the BPF 63, and a pass band with a reduced insertion loss is able to be provided. Specifically, the pass band is defined by the resonant frequencies of the series arm resonators S61 and S62 and the anti-resonant frequency of the parallel arm resonator P61, attenuation poles on the higher-frequency side of the pass band are defined by the anti-resonant frequencies of the series arm resonators S61 and S62, and an attenuation pole (first attenuation pole) on the lower-frequency side of the pass band is defined by the resonant frequency of the parallel arm resonator P61. In addition, by adjusting, as appropriate, the design parameters of the LC resonant circuit 61 and the second LC resonant circuit 62, the LC resonant circuit 61 and the second LC resonant circuit 62 each operate as a notch filter that attenuates the bandpass characteristics in the respective resonant frequencies.

For example, an attenuation pole indicated by a portion A in FIG. 12 (referred to as an attenuation pole A) corresponds to the resonant frequency of the second LC resonant circuit 62, and an attenuation pole indicated by a portion B in FIG. 12 (referred to as an attenuation pole B) corresponds to the resonant frequency of the LC resonant circuit 61. In addition, an attenuation pole indicated by a portion C in FIG. 12 (referred to as an attenuation pole C) corresponds to the resonant frequency of the parallel arm resonator P61.

As illustrated in FIG. 12, a frequency at the attenuation pole C (first attenuation pole) defined by the resonant frequency of the parallel arm resonator P61 and frequencies at the attenuation poles A and B (second attenuation pole) defined by the resonant frequencies of the LC resonant circuit 61 and the second LC resonant circuit 62 are included in one stop band of the high-frequency filter 6. With this configuration, the attenuation poles A and B and the attenuation pole C define the one stop band, and thus the one stop band is able to be broadened by the attenuation poles A and B of the LC resonant circuit 61 and the second LC resonant circuit 62.

In addition, the attenuation pole C on the lower-frequency side of the pass band is defined by the resonant frequency of the parallel arm resonator P61, and thus the frequency at the attenuation pole C is located closer than the frequencies at the attenuation poles A and B to the pass band of the high-frequency filter 6. The attenuation poles of the elastic wave resonators are very steep, and the frequency at the attenuation pole C is located close to the pass band of the high-frequency filter 6. Thus, the steepness of the attenuation slope provided, by the steep attenuation pole C, to extend from the pass band of the high-frequency filter 6 to the one stop band is able to be increased.

In Example 6, as the design parameters of the series arm resonators S61 and S62, the parallel arm resonator P61, the inductors L61 and L62, and the capacitor C61 are adjusted as appropriate, the pass band of the high-frequency filter 6 preferably ranges from, for example, about 2300 MHz to about 2690 MHz, corresponding to the HB. In addition, the stop band of the high-frequency filter 6 preferably ranges from, for example, about 1427 MHz to about 2200 MHz, corresponding to a band ranging from the MLB to the MB.

This configuration makes it possible to achieve a high-frequency filter having a pass band ranging from about 2300 MHz to about 2690 MHz with a highly steep attenuation slope on the low-frequency side and a broad stop band ranging from about 1427 MHz to about 2200 MHz that is located on the lower-frequency side of the pass band. In this manner, the stop band is able to be broadened while the insertion loss within the pass band is reduced.

In Example 6, the BPF 63 preferably has a ladder filter structure including a series coupling number of two and a parallel coupling number of one; specifically, the BPF 63 is defined by the first series arm resonator, the second series arm resonator, and the first parallel arm resonator. This, however, is not a limiting example. For example, a BPF may have a ladder filter structure defined by three or more series arm resonators and two or more parallel arm resonators. Example 7 differs from Example 6 in that a BPF has a ladder filter structure defined by three series arm resonators and two parallel arm resonators.

Figure 13:
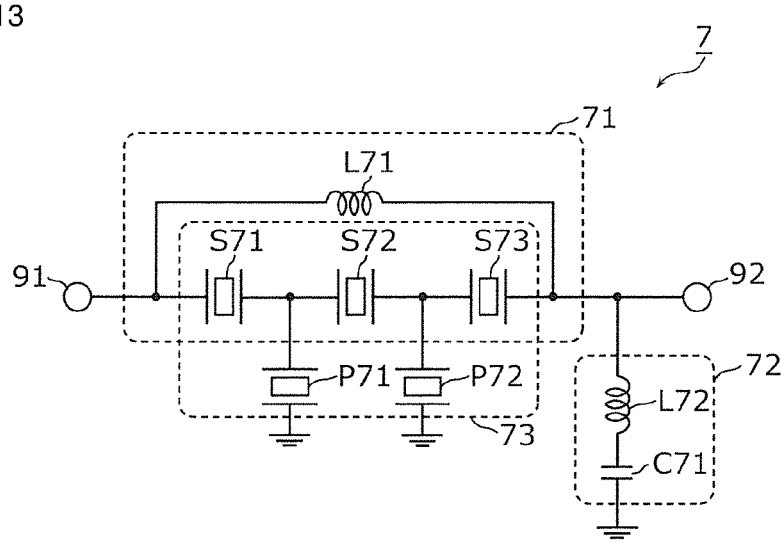
FIG. 13 is a circuit configuration diagram of a high-frequency filter according to Example 7 of a preferred embodiment of the present invention.

FIG. 13 is a circuit configuration diagram of a high-frequency filter 7 according to Example 7. The high-frequency filter 7 illustrated in FIG. 13 includes inductors L71 and L72, a capacitor C71, series arm resonators S71 to S73, parallel arm resonators P71 and P72, and input-output terminals 91 (first input-output terminal) and 92 (second input-output terminal). In Example 7, the at least one elastic wave resonator includes the series arm resonators S71 to S73 and the parallel arm resonators P71 and P72.

The series arm resonator S71 is a first series arm resonator provided on a path connecting the input-output terminal 91 and the input-output terminal 92. The series arm resonator S71 is coupled to the input-output terminal 91. The series arm resonator S73 is a second series arm resonator provided on the stated path. The series arm resonator S73 is coupled to the input-output terminal 92. The series arm resonator S72 is coupled between the series arm resonator S71 and the series arm resonator S73. The series arm resonator S71, the series arm resonator S72, and the series arm resonator S73 are coupled in series on the stated path.

The parallel arm resonators P71 and P72 are first parallel arm resonators coupled between a ground and respective nodes between the series arm resonator S71 and the series arm resonator S73. Specifically, the parallel arm resonator P71 is coupled between a ground and a node between the series arm resonator S71 and the series arm resonator S72, and the parallel arm resonator P72 is coupled between a ground and a node between the series arm resonator S72 and the series arm resonator S73. The series arm resonators S71 to S73 and the parallel arm resonators P71 and P72 preferably have a ladder filter structure and define a band pass filter (BPF) 73.

The inductor L71 is a first inductor defining an LC resonant circuit 71 and is coupled in parallel to a circuit in which the series arm resonator S71, the series arm resonator S72, and the series arm resonator S73 are coupled in series. Capacitance components of the series arm resonators S71 to S73, together with the inductor L71, define an LC parallel resonant circuit, or the LC resonant circuit 71.

The inductor L72 is a fourth inductor defining a portion of a second LC resonant circuit 72. The capacitor C71 is a first capacitor coupled in series to the inductor L72. The circuit in which the capacitor C71 and the inductor L72 are coupled in series is coupled between a ground and a node that is coupled directly to the input-output terminal 91 or 92 on the path connecting the input-output terminal 91 and the input-output terminal 92. Specifically, this circuit is coupled to a ground and a node between the series arm resonator S73 and the input-output terminal 92. The capacitor C71, together with the inductor L72, defines an LC series resonant circuit, or the second LC resonant circuit 72.

The number of the first inductor defining the LC resonant circuit 71 is not limited to one, and two or more first inductors may be provided. The number of the fourth inductor and the number of the first capacitor defining the second LC resonant circuit 72 are not limited to one each, and two or more fourth inductors and two or more first capacitors may be provided.

Next, filter characteristics of the high-frequency filter 7 according to Example 7 will be described.

Figure 14:
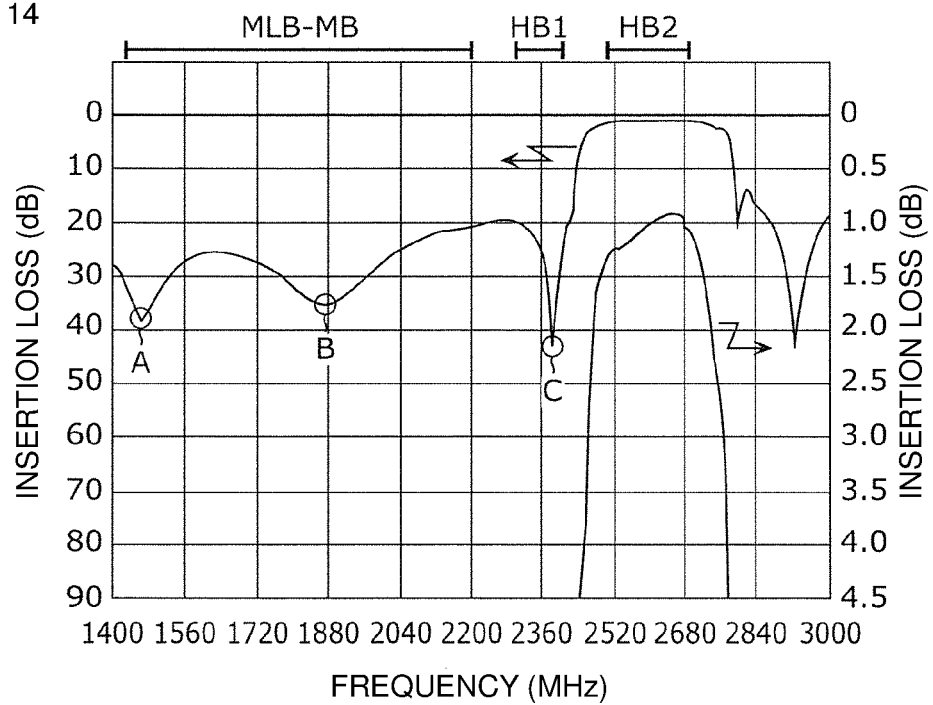
FIG. 14 illustrates filter characteristics of the high-frequency filter according to Example 7.

FIG. 14 illustrates the filter characteristics of the high-frequency filter 7 according to Example 7.

The series arm resonators S71 to S73 and the parallel arm resonators P71 and P72 define the BPF 73, and a pass band with a reduced insertion loss is able to be provided. Specifically, the pass band is defined by the resonant frequencies of the series arm resonators S71 to S73 and the anti-resonant frequencies of the parallel arm resonators P71 and P72, an attenuation pole on the higher-frequency side of the pass band is defined by the anti-resonant frequencies of the series arm resonators S71 to S73, and an attenuation pole (first attenuation pole) on the lower-frequency side of the pass band is defined by the resonant frequencies of the parallel arm resonators P71 and P72. In addition, by adjusting, as appropriate, the design parameters of the LC resonant circuit 71 and the second LC resonant circuit 72, the LC resonant circuit 71 and the second LC resonant circuit 72 each operate as a notch filter that attenuates the bandpass characteristics in the respective resonant frequencies.

For example, an attenuation pole indicated by a portion A in FIG. 14 (referred to as an attenuation pole A) corresponds to the resonant frequency of the second LC resonant circuit 72, and an attenuation pole indicated by a portion B in FIG. 14 (referred to as an attenuation pole B) corresponds to the resonant frequency of the LC resonant circuit 71. In addition, an attenuation pole indicated by a portion C in FIG. 14 (referred to as an attenuation pole C) corresponds to the resonant frequency of at least one of the parallel arm resonators P71 and P72.

As illustrated in FIG. 14, a frequency at the attenuation pole C (first attenuation pole) defined by the resonant frequencies of the parallel arm resonators P71 and P72 and frequencies at the attenuation poles A and B (second attenuation pole) defined by the resonant frequencies of the LC resonant circuit 71 and the second LC resonant circuit 72 are included in one stop band of the high-frequency filter 7. With this configuration, the attenuation poles A and B and the attenuation pole C define the one stop band, and thus the one stop band is able to be broadened by the attenuation poles A and B of the LC resonant circuit 71 and the second LC resonant circuit 72.

In addition, the attenuation pole C on the lower-frequency side of the pass band is defined by the resonant frequencies of the parallel arm resonators P71 and P72, and thus the frequency at the attenuation pole C is located closer than the frequencies at the attenuation poles A and B to the pass band of the high-frequency filter 7. The attenuation poles of the elastic wave resonators are very steep, and the frequency at the attenuation pole C is located close to the pass band of the high-frequency filter 7. Thus, the steepness of the attenuation slope provided, by the steep attenuation pole C, to extend from the pass band of the high-frequency filter 7 to the one stop band is able to be increased.

In Example 7, as the design parameters of the series arm resonators S71 to S73, the parallel arm resonators P71 and P72, the inductors L71 and L72, and the capacitor C71 are adjusted as appropriate, the pass band of the high-frequency filter 7 preferably ranges from, for example, about 2496 MHz to about 2690 MHz, corresponding to an HB2 (Band 41 of LTE (Long Term Evolution)). In addition, the stop band of the high-frequency filter 7 preferably ranges from, for example, about 1427 MHz to about 2400 MHz, corresponding to a band ranging from the MLB to an HB1 (Band 40 of LTE). It is to be noted that the HB1 ranges from about 2300 MHz to about 2400 MHz.

The above-described configuration makes it possible to achieve a high-frequency filter having a pass band ranging from about 2496 MHz to about 2690 MHz with a very steep attenuation slope on the low-frequency side and a broad stop band ranging from about 1427 MHz to about 2400 MHz that is located on the lower-frequency side of the pass band. In this manner, the stop band is able to be broadened while the insertion loss within the pass band is reduced.

In Example 7, the high-frequency filter 7 includes the second LC resonant circuit 72, but the second LC resonant circuit 72 need not be provided. Example 8 differs from Example 7 in that a high-frequency filter includes no second LC resonant circuit.

Figure 15:
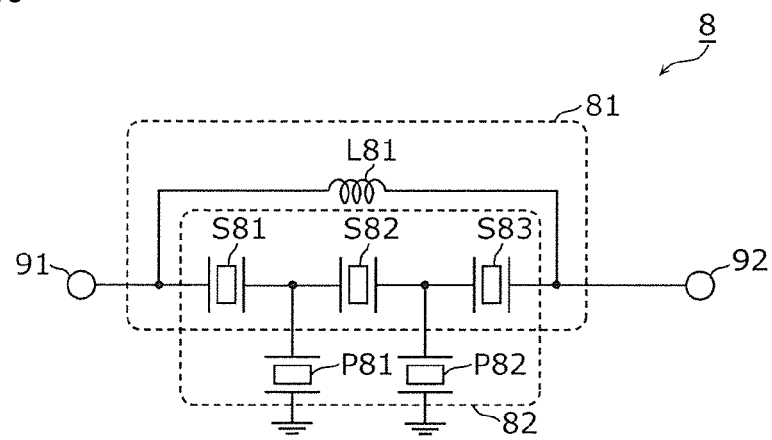
FIG. 15 is a circuit configuration diagram of a high-frequency filter according to Example 8 of a preferred embodiment of the present invention.

FIG. 15 is a circuit configuration diagram of a high-frequency filter 8 according to Example 8.

Series arm resonators S81 to S83, parallel arm resonators P81 and P82, an inductor L81, an LC resonant circuit 81, and a BPF 82 according to Example 8 correspond, respectively, to the series arm resonators S71 to S73, the parallel arm resonators P71 and P72, the inductor L71, the LC resonant circuit 71, and the BPF 73 according to Example 7, and thus descriptions of the configuration of the high-frequency filter 8 will be omitted.

The high-frequency filter 8 may be defined at least by the inductor L81, the series arm resonators S81 and S83, and the parallel arm resonator P81.

Next, filter characteristics of the high-frequency filter 8 according to Example 8 will be described.

Figure 16:
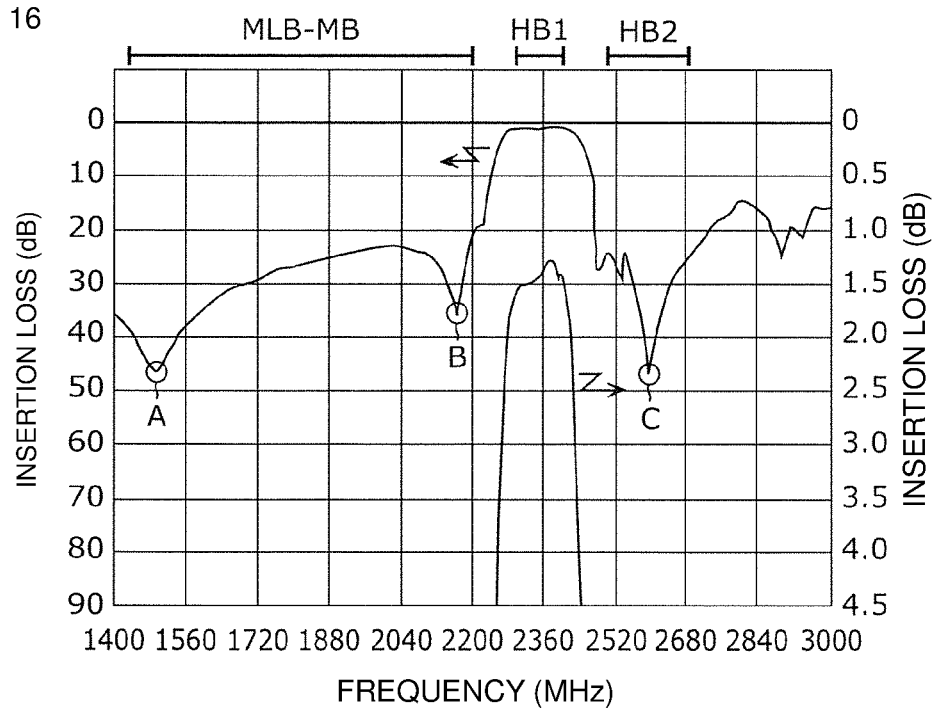
FIG. 16 illustrates filter characteristics of the high-frequency filter according to Example 8.

FIG. 16 illustrates the filter characteristics of the high-frequency filter 8 according to Example 8.

The series arm resonators S81 to S83 and the parallel arm resonators P81 and P82 define the BPF 82, and a pass band with a reduced insertion loss is able to be provided. Specifically, the pass band is defined by the resonant frequencies of the series arm resonators S81 to S83 and the anti-resonant frequencies of the parallel arm resonators P81 and P82, an attenuation pole on the higher-frequency side of the pass band is defined by the anti-resonant frequencies of the series arm resonators S81 to S83, and an attenuation pole (first attenuation pole) on the lower-frequency side of the pass band is defined by the resonant frequencies of the parallel arm resonators P81 and P82. In addition, by adjusting, as appropriate, the design parameters of the LC resonant circuit

81, the LC resonant circuit 81 operates as a notch filter that attenuates the bandpass characteristics in the resonant frequency.

For example, an attenuation pole indicated by a portion A in FIG. 16 (referred to as an attenuation pole A) corresponds to the resonant frequency of the LC resonant circuit 81. In addition, an attenuation pole indicated by a portion B in FIG. 16 (referred to as an attenuation pole B) corresponds to the resonant frequency of at least one of the parallel arm resonators P81 and P82. Furthermore, an attenuation pole indicated by a portion C in FIG. 16 (referred to as an attenuation pole C) corresponds to the anti-resonant frequency of at least one of the series arm resonators S81 to S83.

As illustrated in FIG. 16, a frequency at the attenuation pole B (first attenuation pole) defined by the resonant frequencies of the parallel arm resonators P81 and P82 and a frequency at the attenuation pole A (second attenuation pole) defined by the resonant frequency of the LC resonant circuit 81 are included in one stop band of the high-frequency filter 8. With this configuration, the attenuation pole A and the attenuation pole B define the one stop band, and thus the one stop band is able to be broadened by the gentle attenuation pole A of the LC resonant circuit 81. In addition, the attenuation pole C is defined by the anti-resonant frequencies of the series arm resonators S81 to S83.

The attenuation pole B on the lower-frequency side of the pass band is defined by the resonant frequencies of the parallel arm resonators P81 and P82, and thus the frequency at the attenuation pole B is located closer than the frequency at the attenuation pole A to the pass band of the high-frequency filter 8. The attenuation poles of the elastic wave resonators are very steep, and the frequency at the attenuation pole B is located close to the pass band of the high-frequency filter 8. Thus, the steepness of the attenuation slope provided, by the steep attenuation pole B, to extend from the pass band of the high-frequency filter 8 to the one stop band is able to be increased.

In Example 8, as the design parameters of the series arm resonators S81 to S83, the parallel arm resonators P81 and P82, and the inductor L81 are adjusted as appropriate, the pass band of the high-frequency filter 8 preferably ranges from, for example, about 2300 MHz to about 2400 MHz, corresponding to the HB1. In addition, the one stop band of the high-frequency filter 8 preferably ranges from, for example, about 1427 MHz to about 2200 MHz, corresponding to a band ranging from the MLB to the MB. In addition, the other stop band of the high-frequency filter 8 preferably ranges from, for example, about 2496 MHz to about 2690 MHz, corresponding to the HB2.

This configuration makes it possible to achieve a high-frequency filter having a pass band ranging from about 2300 MHz to about 2400 MHz with a very steep attenuation slope on the low-frequency side and a broad stop band ranging from about 1427 MHz to about 2200 MHz that is located on the lower-frequency side of the pass band. In this manner, the stop band is able to be broadened while the insertion loss within the pass band is reduced.

To handle carrier aggregation (CA), a branching filter that isolates (separates) a high-frequency signal into respective frequency bands is widely used. As such a branching filter, a multiplexer that includes a plurality of filters is proposed. In such a multiplexer, terminals on one ends of the filters are directly coupled into a common terminal or guided into a common terminal via a phase shifter or a filter selection switch. This configuration may allow the characteristics of one of the filters having the terminals on one ends guided into a common terminal to affect the characteristics of another filter. For example, in a case in which the attenuation in the stop band of the one filter corresponding to the frequency range of the pass band of the other filter is small, the characteristics of the one filter affect the characteristics of the other filter, which causes the bandpass characteristics in the pass band of the other filter to deteriorate.

In this respect, the high-frequency filters described in Examples 1 to 8 each have a very steep attenuation slope extending from the pass band to one stop band, and the one stop band is broadened. Therefore, applying the high-frequency filters according to Examples 1 to 8 to the one filter provided in the multiplexer makes it possible to reduce or prevent a deterioration in the bandpass characteristics in the pass band of each filter provided in the multiplexer.

Accordingly, described in Examples 9 and 10 are multiplexers each including a plurality of filters that include at least one of the high-frequency filters described in Examples 1 to 8. In such a multiplexer, input terminals or output terminals of the respective filters are coupled directly or indirectly to a common terminal. It is to be noted that the multiplexer, for example, is a diplexer in a case in which the plurality of filters include two filters, is a triplexer in a case in which the plurality of filters include three filters, and is a quadplexer in a case in which the plurality of filters include four filters. The number of the plurality of filters may be five or more. A multiplexer (triplexer) in which the plurality of filters include three filters will be described in Example 9, and a multiplexer (diplexer) in which the plurality of filters include two filters will be described in Example 10.

Figure 17:
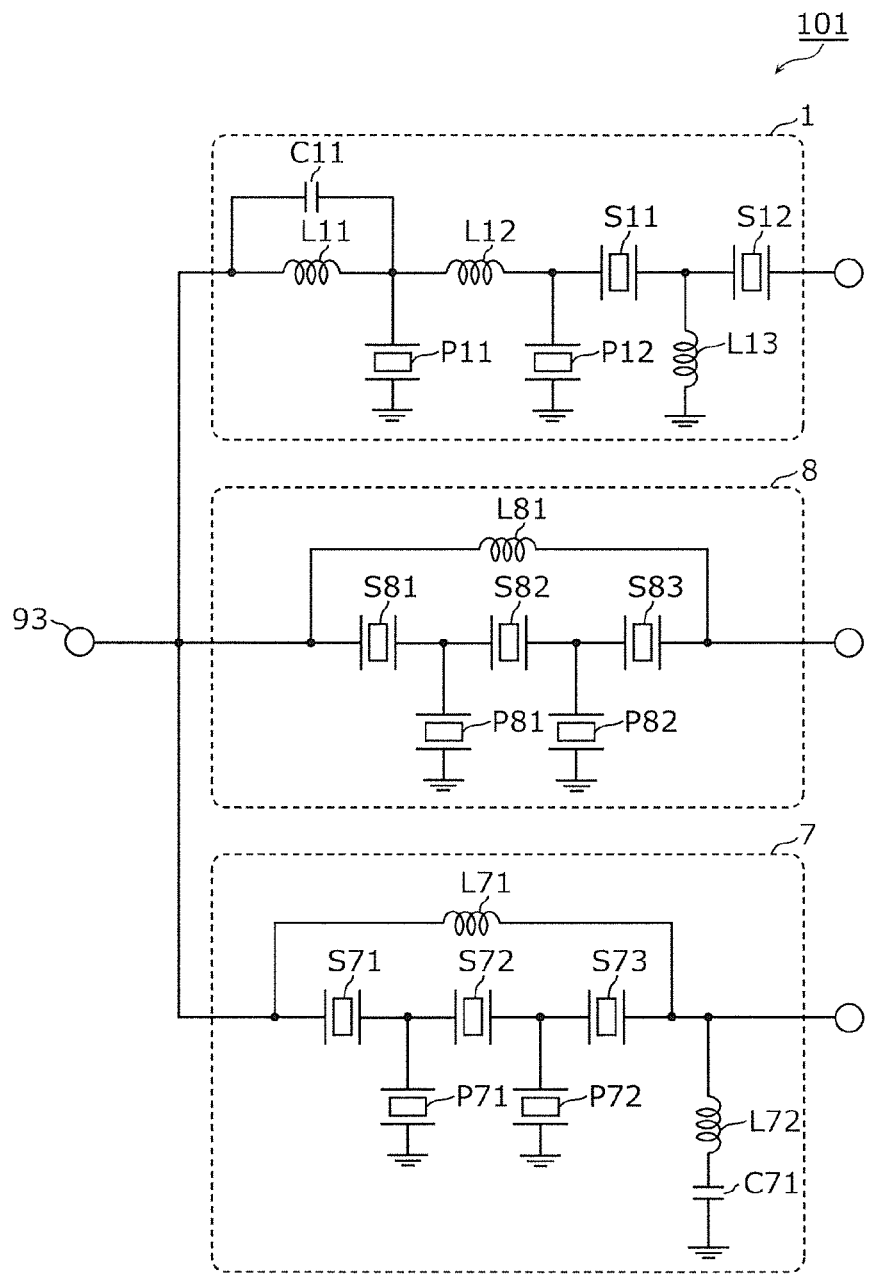
FIG. 17 is a circuit configuration diagram of a multiplexer (triplexer) according to Example 9 of a preferred embodiment of the present invention.

FIG. 17 is a circuit configuration diagram of a multiplexer (triplexer) 101 according to Example 9. The multiplexer 101 includes the high-frequency filter 1 according to Example 1, the high-frequency filter 7 according to Example 7, and the high-frequency filter 8 according to Example 8. The input-output terminals 91 included in the respective high-frequency filters are coupled to a common terminal 93.

As illustrated in FIG. 2, the high-frequency filter 1 preferably has a broad stop band ranging from, for example, about 2300 MHz to about 2690 MHz, corresponding to the HB. Meanwhile, as illustrated in FIG. 14, the high-frequency filter 7 has a pass band preferably ranging from, for example, about 2496 MHz to about 2690 MHz, corresponding to the HB2, which is included in the HB. As illustrated FIG. 16, the high-frequency filter 8 has a pass band preferably ranging from, for example, about 2300 MHz to about 2400 MHz, corresponding to the HB1, which is included in the HB. In this manner, the pass bands of the high-frequency filters 7 and 8 are included in the stop band of the high-frequency filter 1. Thus, the high-frequency filters 7 and 8 are less likely to be affected by the high-frequency filter 1, which makes it possible to reduce or prevent a deterioration in the bandpass characteristics in the pass bands of the high-frequency filters 7 and 8.

As illustrated in FIG. 14 and FIG. 16, the high-frequency filters 7 and 8 have a broad stop band ranging from about 1427 MHz to about 2200 MHz, corresponding to a band ranging from the MLB to the MB. Meanwhile, as illustrated in FIG. 2, the high-frequency filter 1 has a pass band ranging from about 1427 MHz to about 2200 MHz, corresponding to a band ranging from the MLB to the MB. In this manner, the pass band of the high-frequency filter 1 overlaps the stop bands of the high-frequency filters 7 and 8. Thus, the high-frequency filter 1 is less likely to be affected by the high-frequency filters 7 and 8, which makes it possible to reduce or prevent a deterioration in the bandpass characteristics in the pass band of the high-frequency filter 1.

In addition, as illustrated in FIG. 14, the high-frequency filter 7 has a stop band ranging from about 2300 MHz to about 2400 MHz, corresponding to the HB1. As illustrated in FIG. 16, the high-frequency filter 8 has a pass band ranging from about 2300 MHz to about 2400 MHz, corresponding to the HB1. In this manner, the pass band of the high-frequency filter 8 overlaps the stop band of the high-frequency filter 7. Thus, the high-frequency filter 8 is less likely to be affected by the high-frequency filter 7, which makes it possible to reduce or prevent a deterioration in the bandpass characteristics in the pass band of the high-frequency filter 8.

In addition, as illustrated in FIG. 16, the high-frequency filter 8 has a stop band ranging from about 2496 MHz to about 2690 MHz, corresponding to the HB2. As illustrated in FIG. 14, the high-frequency filter 7 has a pass band ranging from about 2496 MHz to about 2690 MHz, corresponding to the HB2. In this manner, the pass band of the high-frequency filter 7 overlaps the stop band of the high-frequency filter 8. Thus, the high-frequency filter 7 is less likely to be affected by the high-frequency filter 8, which makes it possible to reduce or prevent a deterioration in the bandpass characteristics in the pass band of the high-frequency filter 7.

Furthermore, the frequency at the high-frequency side of the pass band of the high-frequency filter 1 is close to the frequency at the low-frequency side of the pass band of the high-frequency filter 8. However, the attenuation slope on the high-frequency side of the pass band of the high-frequency filter 1 is very steep, and the attenuation slope on the low-frequency side of the pass band of the high-frequency filter 8 is very steep. Thus, the pass bands of the high-frequency filters 1 and 8 are less likely to be affected by each other, which makes it possible to reduce or prevent a deterioration in the bandpass characteristics in the pass band of each of the high-frequency filters 1 and 8.

In addition, the frequency at the high-frequency side of the pass band of the high-frequency filter 8 is close to the frequency at the low-frequency side of the pass band of the high-frequency filter 7. However, the attenuation slope on the high-frequency side of the pass band of the high-frequency filter 8 is very steep, and the attenuation slope on the low-frequency side of the pass band of the high-frequency filter 7 is very steep. Thus, the pass bands of the high-frequency filters 7 and 8 are less likely to be affected by each other, which makes it possible to reduce or prevent a deterioration in the bandpass characteristics in the pass band of each of the high-frequency filters 7 and 8.

It is to be noted that the multiplexer 101 may further include, in addition to the high-frequency filters 1, 7, and 8, an LPF coupled to the common terminal 93. The pass band of this LPF preferably ranges, for example, from about 600 MHz to about 960 MHz, corresponding to the LB. In this case, the multiplexer 101 includes four filters including a filter having a pass band ranging from about 600 MHz to about 960 MHz, a filter having a pass band ranging from about 1427 MHz to about 2200 MHz, a filter having a pass band ranging from about 2300 MHz to about 2400 MHz, and a filter having a pass band ranging from about 2496 MHz to about 2690 MHz.

The multiplexer 101 configured as described above is able to simultaneously transmit and/or receive signals in a plurality of frequency bands corresponding to the respective filters; that is, the multiplexer 101 is able to handle what is called CA.

Figure 18:
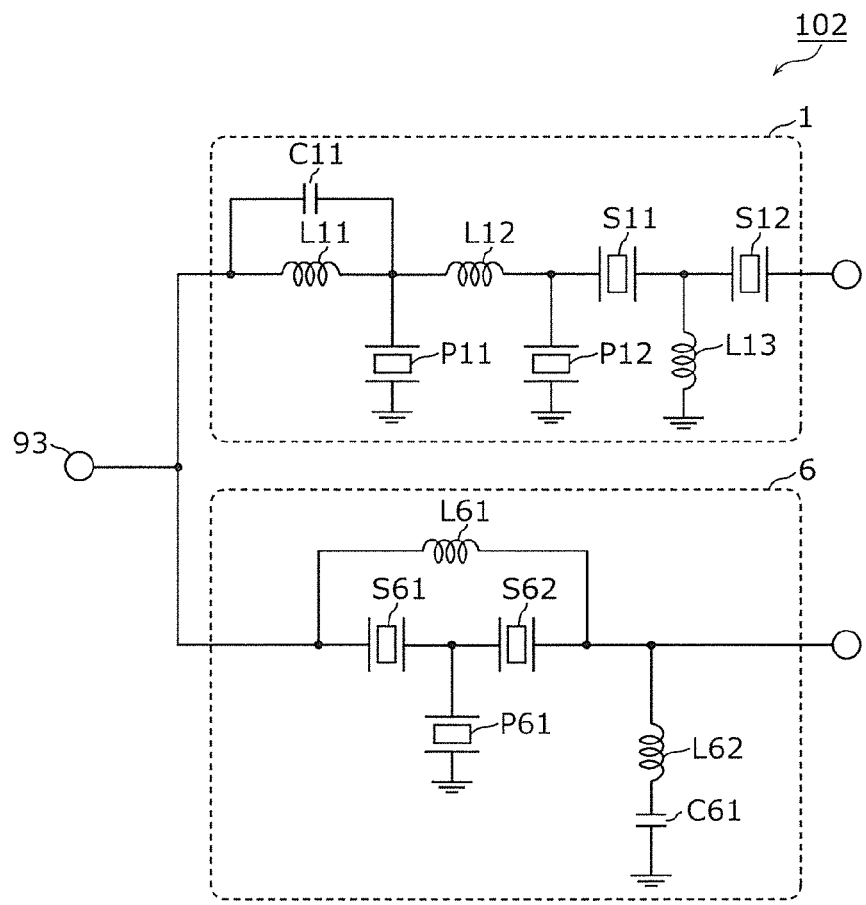
FIG. 18 is a circuit configuration diagram of a multiplexer (diplexer) according to Example 10 of a preferred embodiment of the present invention.

FIG. 18 is a circuit configuration diagram of a multiplexer (diplexer) 102 according to Example 10. The multiplexer 102 includes the high-frequency filter 1 according to Example 1 and the high-frequency filter 6 according to Example 6. The input-output terminals 91 included in the respective high-frequency filters are coupled to a common terminal 93.

As illustrated in FIG. 2, the high-frequency filter 1 has a broad stop band preferably ranging from, for example, about 2300 MHz to about 2690 MHz, corresponding to the HB. As illustrated in FIG. 12, the high-frequency filter 6 has a pass band preferably ranging from, for example, about 2300 MHz to about 2690 MHz, corresponding to the HB. In this manner, the pass band of the high-frequency filter 6 overlaps the stop band of the high-frequency filter 1. Thus, the high-frequency filter 6 is less likely to be affected by the high-frequency filter 1, which makes it possible to reduce or prevent a deterioration in the bandpass characteristics in the pass band of the high-frequency filter 6.

As illustrated in FIG. 12, the high-frequency filter 6 has a broad stop band preferably ranging from, for example, about 1427 MHz to about 2200 MHz, corresponding to a band ranging from the MLB to the MB. Meanwhile, as illustrated in FIG. 2, the high-frequency filter 1 has a pass band preferably ranging from, for example, about 1427 MHz to about 2200 MHz, corresponding to a band ranging from the MLB to the MB. In this manner, the pass band of the high-frequency filter 1 overlaps the stop band of the high-frequency filter 6. Thus, the high-frequency filter 1 is less likely to be affected by the high-frequency filter 6, which makes it possible to reduce or prevent a deterioration in the bandpass characteristics in the pass band of the high-frequency filter 1.

Furthermore, the frequency at the high-frequency side of the pass band of the high-frequency filter 1 is close to the frequency at the low-frequency side of the pass band of the high-frequency filter 6. However, the attenuation slope on the high-frequency side of the pass band of the high-frequency filter 1 is very steep, and the attenuation slope on the low-frequency side of the pass band of the high-frequency filter 6 is very steep. Thus, the pass bands of the high-frequency filters 1 and 6 are less likely to be affected by each other, which makes it possible to reduce or prevent a deterioration in the bandpass characteristics in the pass band of each of the high-frequency filters 1 and 6.

It is to be noted that the multiplexer 102 may further include, in addition to the high-frequency filters 1 and 6, an LPF coupled to the common terminal 93. The pass band of this LPF preferably ranges, for example, from about 600 MHz to about 960 MHz, corresponding to the LB. In this case, the multiplexer 102 includes three filters including a filter having a pass band ranging from about 600 MHz to about 960 MHz, a filter having a pass band ranging from about 1427 MHz to about 2200 MHz, and a filter having a pass band ranging from about 2300 MHz to about 2690 MHz.

The multiplexer 102 configured as described above is able to simultaneously transmit and/or receive signals in a plurality of frequency bands corresponding to the respective filters; that is, the multiplexer 102 is able to handle what is called CA.

Preferred Embodiment 2

The high-frequency filters described in the examples of Preferred Embodiment 1 may be applied to a high-frequency front-end circuit and a communication device. Thus, in Preferred Embodiment 2 of the present invention, a high-frequency front-end circuit and a communication device will be described.

Figure 19:
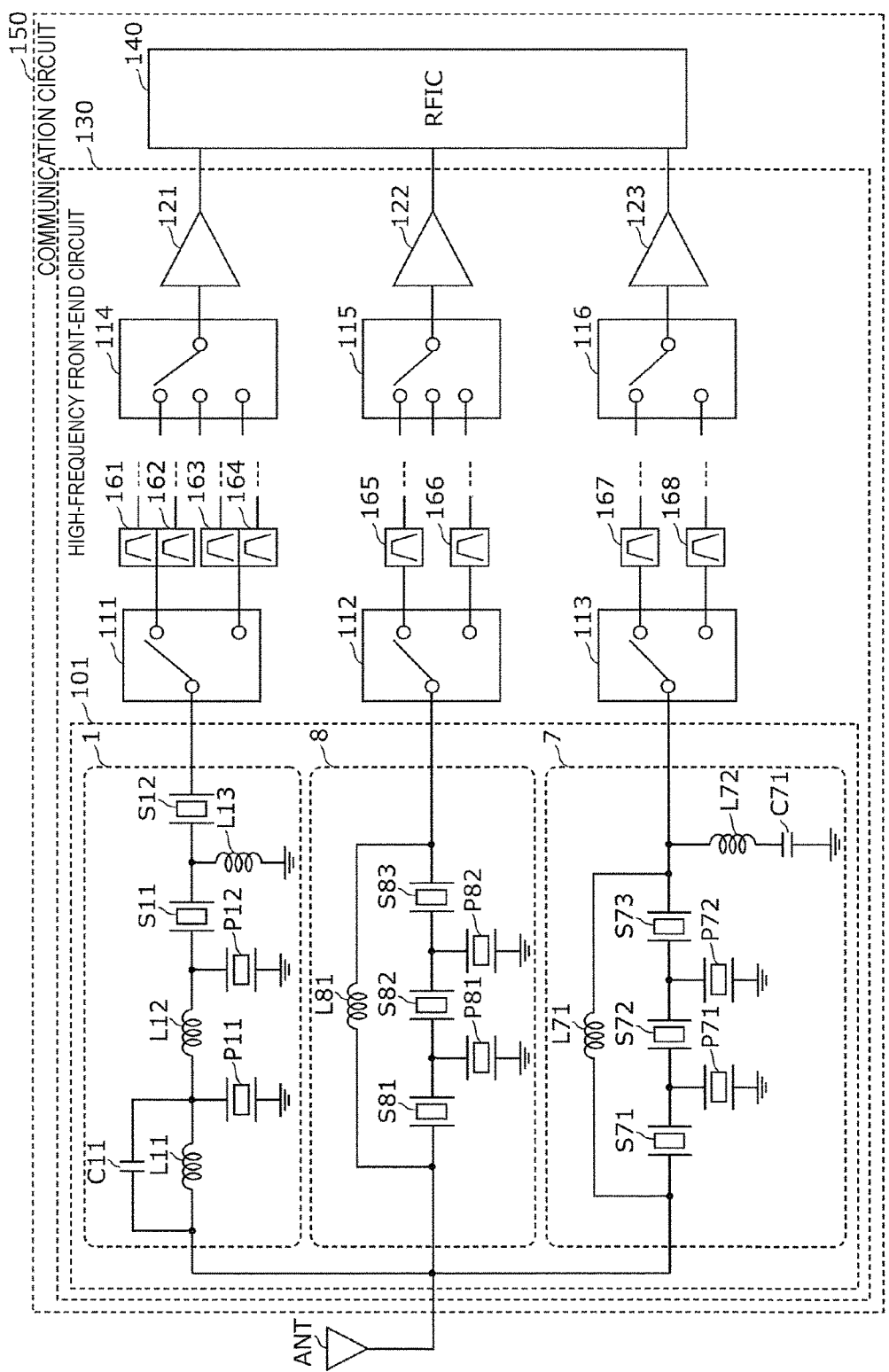
FIG. 19 is a circuit configuration diagram of a communication device according to a preferred embodiment of the present invention.

FIG. 19 is a circuit configuration diagram of a communication device 150 according to Preferred Embodiment 2.

As illustrated in FIG. 19, the communication device 150 includes a high-frequency front-end circuit 130 and an RF signal processing circuit (RFIC) 140. An antenna element ANT is also illustrated in FIG. 19. The antenna element ANT transmits and/or receives a high-frequency signal and is, for example, a multiband-compatible antenna compliant with a communication standard, such as LTE. The antenna element ANT may be integrated into the communication device 150.

The high-frequency front-end circuit 130 transmits a high-frequency signal between the antenna element ANT and the RFIC 140. Specifically, the high-frequency front-end circuit 130 transmits a high-frequency signal (high-frequency reception signal in this example) received by the antenna element ANT to the RFIC 140 through a reception-side signal path.

The high-frequency front-end circuit 130 includes the multiplexer 101, switches 111 to 116, amplification circuits 121 to 123, and band pass filters (BPFs) 161 to 168. The BPFs 161 and 162 define a duplexer, and the BPFs 163 and 164 define another duplexer. The multiplexer 101 is able to handle CA, for example, as described in Example 9. The multiplexer included in the high-frequency front-end circuit 130 is not limited to the multiplexer 101 and may be any multiplexer that is defined by a plurality of filters including at least one of the high-frequency filters according to Examples 1 to 8.

The switches 111 to 113 are coupled between the multiplexer 101 and the BPFs 161 to 168. In accordance with a control signal from a controller (not illustrated), the switches 111 to 113 couple the BPFs 161 to 168 to signal paths corresponding to the respective bands (the band ranging from the MLB to the MB, the HB1, and the HB2 in this example) that mutually differ in the frequency band.

Specifically, the common terminal of the switch 111 is coupled to the high-frequency filter 1 and the selection terminals of the switch 111 are coupled to the BPFs 161 to 164. The common terminal of the switch 112 is coupled to the high-frequency filter 8 and the selection terminals of the switch 112 are coupled to the BPFs 165 and 166. The common terminal of the switch 113 is coupled to the high-frequency filter 7 and the selection terminals of the switch 113 are coupled to the BPFs 167 and 168.

The switches 114 to 116 are coupled between the amplification circuits 121 to 123 and the BPFs 161 to 168. In accordance with a control signal from a control unit (not illustrated), the switches 114 to 116 couple the BPFs 161 to 168 to the amplification circuits 121 to 123.

Specifically, the common terminal of the switch 114 is coupled to the amplification circuit 121 and the selection terminals of the switch are coupled to the BPFs 161 to 164. The common terminal of the switch 115 is coupled to the amplification circuit 122 and the selection terminals of the switch 115 are coupled to the BPFs 165 and 166. The common terminal of the switch 116 is coupled to the amplification circuit 123 and the selection terminals of the switch 116 are coupled to the BPFs 167 and 168.

It is to be noted that the pass band (from about 1427 MHz to about 2200 MHz) of the high-frequency filter 1 is broader than the pass bands of the respective BPFs 161 to 164 and includes the pass bands. The pass band (from about 2300 MHz to about 2400 MHz) of the high-frequency filter 8 includes the pass bands of the BPFs 165 and 166. The pass band (from about 2496 MHz to about 2690 MHz) of the high-frequency filter 7 includes the pass bands of the BPFs 167 and 168.

The amplification circuits 121 to 123 are preferably low noise amplifiers, for example, that are coupled to the multiplexer 101, for example, with the switches 111 to 116 and the BPFs 161 to 168 interposed therebetween and that amplify the power of a high-frequency reception signal received by the antenna element ANT.

The RFIC 140 is an RF signal processing circuit that processes a high-frequency signal transmitted and/or received by the antenna element ANT. Specifically, the RFIC 140 processes, for example, through down-conversion, a high-frequency signal (high-frequency reception signal in this example) input from the antenna element ANT through the reception-side signal path of the high-frequency front-end circuit 130. The RFIC 140 then outputs a reception signal generated through the signal processing to a baseband signal processing circuit (not illustrated).

In the communication device 150 having the configuration described above, for example, a CA operation is able to be performed by switching each of the switches 111 to 113 to select one band for each from the band ranging from the MLB to the MB (from about 1427 MHz to about 2200 MHz), the HB1 (from about 2300 MHz to about 2400 MHz), and the HB2 (from about 2496 MHz to about 2690 MHz).

The high-frequency front-end circuit 130 may include a transmission-side signal path and transmit a high-frequency signal (high-frequency transmission signal in this example) output from the RFIC 140 to the antenna element ANT through the transmission-side signal path. In this case, the RFIC 140 may process, through, for example, up-conversion, a transmission signal input from a baseband signal processing circuit and output a high-frequency signal (high-frequency transmission signal in this example) generated through the signal processing to the transmission-side signal path of the high-frequency front-end circuit 130. The amplification circuits 121 to 123 may be power amplifiers that amplify the power of the high-frequency transmission signal output from the RFIC 140.

The aforementioned controller, although not illustrated in FIG. 19, may be included in the RFIC 140 or may, together with the switches controlled by the control unit, define a switch IC.

With the high-frequency front-end circuit 130 and the communication device 150 configured as described above, as the filters according to the examples of Preferred Embodiment 1 are included, high-performance high-frequency front-end circuits and communication devices that are able to broaden the stop band while reducing the insertion loss within the pass band are achieved.

The high-frequency filters, the multiplexers, the high-frequency front-end circuits, and the communication devices according to preferred embodiments of the present invention have been described with reference to Preferred Embodiments 1 and 2. The present invention, however, is not limited to the preferred embodiments described above. The present invention also encompasses other preferred embodiments achieved through a combination of certain elements in the preferred embodiments described above, modifications obtained by making various changes to the preferred embodiments described above that are conceivable by a person skilled in the art within the scope that does not depart from the spirit of the present invention, and various devices into which the high-frequency filters, the multiplexers, the high-frequency front-end circuits, and the communication devices according to preferred embodiments of the present invention are integrated.

For example, each of the elastic wave resonators described above is not limited to a single resonator and may be defined by a plurality of divided resonators obtained by dividing one resonator.

In addition, for example, in the high-frequency filters, the multiplexers, the high-frequency front-end circuits, and the communication devices, an inductor or a capacitor may be coupled between the elements. An inductor may include a wire inductor defined by a wire that provides a connection between the elements.

In addition, although the multiplexers in Examples 9 and 10 each include some of the high-frequency filters according to Examples 1 to 8, for example, it suffices that a multiplexer include at least one of the high-frequency filters according to Examples 1 to 8.

In addition, although the high-frequency front-end circuit 130 includes one switch 110 and one amplification circuit 120 in Embodiment 2, for example, the high-frequency front-end circuit 130 may include a plurality of switches 110 and a plurality of amplification circuits 120. In addition, the high-frequency front-end circuit 130 need not include both of the switch 110 and the amplification circuit 120 and may include either one of the switch 110 and the amplification circuit 120.

In addition, although the multiplexers described in the foregoing preferred embodiments are used to separate an input high-frequency signal into different frequency bands, the multiplexers may be used to combine high-frequency signals.

Preferred embodiments of the present invention may be widely used in communication apparatuses, such as cellular phones, as high-frequency filters, multiplexers, front-end circuits, and communication devices, that utilize multiband systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency filter coupled between a first input-output terminal and a second input-output terminal, the high-frequency filter comprising:
    at least one elastic wave resonator; and
    a first inductor defining a portion of an LC resonant circuit; wherein
    a frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter;
    the frequency at the first attenuation pole is closer than the frequency at the second attenuation pole to a pass band of the high-frequency filter;
    the at least one elastic wave resonator includes a first elastic wave resonator and a second elastic wave resonator;
    the high-frequency filter further includes a first capacitor, a second inductor, and a third inductor;
    the first inductor, the second inductor, and the second elastic wave resonator are coupled in series on a path connecting the first input-output terminal and the second input-output terminal;
    the first capacitor is coupled in parallel to the first inductor;
    the first elastic wave resonator is coupled between a ground and a node that is coupled directly to the second inductor on the path;
    the third inductor is coupled between a ground and a node that is coupled directly to the second elastic wave resonator on the path;
    the first capacitor, together with the first inductor, defines an LC parallel resonant circuit defining the LC resonant circuit;
    the second inductor, together with a capacitance component of the first elastic wave resonator, defines a low pass filter; and
    the third inductor, together with a capacitance component of the second elastic wave resonator, defines a high pass filter.

2. The high-frequency filter according to claim 1, wherein the at least one elastic wave resonator is a low pass filter or a high pass filter with a capacitance component.

3. A multiplexer, comprising:
    a plurality of filters including at least one high-frequency filter according to claim 1; wherein
    input terminals or output terminals of the plurality of filters are coupled directly or indirectly to a common terminal.

4. The multiplexer according to claim 3, wherein the plurality of filters include two filters.

5. The multiplexer according to claim 3, wherein the plurality of filters include three filters.

6. The multiplexer according to claim 5, wherein the three filters include:
    a filter having a pass band ranging from about 600 MHz to about 960 MHz;
    a filter having a pass band ranging from about 1427 MHz to about 2200 MHz; and
    a filter having a pass band ranging from about 2300 MHz to about 2690 MHz.

7. The multiplexer according to claim 3, wherein the plurality of filters include four filters.

8. The multiplexer according to claim 7, wherein the four filters include:
    a filter having a pass band ranging from about 600 MHz to about 960 MHz;
    a filter having a pass band ranging from about 1427 MHz to about 2200 MHz;
    a filter having a pass band ranging from about 2300 MHz to about 2400 MHz; and
    a filter having a pass band ranging from about 2496 MHz to about 2690 MHz.

9. The multiplexer according to claim 3, wherein the plurality of filters include a low pass filter.

10. The multiplexer according to claim 3, wherein signals in a plurality of frequency bands corresponding to the respective filters are transmitted and/or received simultaneously.

11. A high-frequency front-end circuit, comprising:
    the multiplexer according to claim 3; and
    a switch coupled directly or indirectly to the multiplexer.

12. A communication device, comprising:
    an RF signal processing circuit that processes a high-frequency signal transmitted and/or received via an antenna element; and the high-frequency front-end circuit according to claim 11 that transmits the high-frequency signal between the antenna element and the RF signal processing circuit.

13. A high-frequency front-end circuit, comprising:
the multiplexer according to claim 3; and
an amplification circuit coupled directly or indirectly to the multiplexer.

14. A communication device, comprising:
an RF signal processing circuit that processes a high-frequency signal transmitted and/or received via an antenna element; and
the high-frequency front-end circuit according to claim 13 that transmits the high-frequency signal between the antenna element and the RF signal processing circuit.

15. A high-frequency filter coupled between a first input-output terminal and a second input-output terminal, the high-frequency filter comprising:
at least one elastic wave resonator; and
a first inductor defining a portion of an LC resonant circuit; wherein
a frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter;
the frequency at the first attenuation pole is closer than the frequency at the second attenuation pole to a pass band of the high-frequency filter;
the at least one elastic wave resonator is a first elastic wave resonator;
the high-frequency filter further includes a first capacitor;
the first inductor is provided on a path connecting the first input-output terminal and the second input-output terminal;
the first capacitor is coupled in parallel to the first inductor;
the first elastic wave resonator is coupled between a ground and a node that is coupled directly to the first inductor on the path;
the first capacitor, together with the first inductor, defines an LC parallel resonant circuit defining the LC resonant circuit; and
the first inductor, together with a capacitance component of the first elastic wave resonator, further defines a low pass filter.

16. A multiplexer, comprising:
a plurality of filters including at least one high-frequency filter according to claim 15; wherein
input terminals or output terminals of the plurality of filters are coupled directly or indirectly to a common terminal.

17. A high-frequency filter coupled between a first input-output terminal and a second input-output terminal, the high-frequency filter comprising:
at least one elastic wave resonator; and
a first inductor defining a portion of an LC resonant circuit; wherein
a frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter;
the frequency at the first attenuation pole is closer than the frequency at the second attenuation pole to a pass band of the high-frequency filter;
the at least one elastic wave resonator is a second elastic wave resonator;
the high-frequency filter further includes a first capacitor;
the second elastic wave resonator is provided on a path connecting the first input-output terminal and the second input-output terminal;
the first capacitor and the first inductor are coupled in series;
a circuit including the first capacitor and the first inductor coupled in series is coupled between a ground and a node that is coupled directly to the second elastic wave resonator on the path;
the first capacitor, together with the first inductor, defines an LC series resonant circuit defining the LC resonant circuit; and
the first inductor, together with a capacitance component of the second elastic wave resonator, further defines a high pass filter.

18. A multiplexer, comprising:
a plurality of filters including at least one high-frequency filter according to claim 17; wherein
input terminals or output terminals of the plurality of filters are coupled directly or indirectly to a common terminal.

19. A high-frequency filter coupled between a first input-output terminal and a second input-output terminal, the high-frequency filter comprising:
at least one elastic wave resonator; and
a first inductor defining a portion of an LC resonant circuit; wherein
a frequency at a first attenuation pole defined by a resonant frequency or an anti-resonant frequency of the at least one elastic wave resonator and a frequency at a second attenuation pole defined by a resonant frequency of the LC resonant circuit are included in one stop band of the high-frequency filter;
the frequency at the first attenuation pole is closer than the frequency at the second attenuation pole to a pass band of the high-frequency filter;
the at least one elastic wave resonator is a second elastic wave resonator;
the high-frequency filter further includes a first capacitor and a third inductor;
the second elastic wave resonator is provided on a path connecting the first input-output terminal and the second input-output terminal;
the first capacitor and the first inductor are coupled in series;
a circuit including the first capacitor and the first inductor coupled in series is coupled between a ground and the path;
the third inductor is coupled between a ground and a node that is coupled directly to the second elastic wave resonator on the path;
the first capacitor, together with the first inductor, defines an LC series resonant circuit defining the LC resonant circuit; and
the third inductor, together with a capacitance component of the second elastic wave resonator, defines a high pass filter.

20. A multiplexer, comprising:
a plurality of filters including at least one high-frequency filter according to claim 19; wherein
input terminals or output terminals of the plurality of filters are coupled directly or indirectly to a common terminal.

* * * * *